(12) United States Patent
Tsukuda et al.

(10) Patent No.: US 11,006,060 B2
(45) Date of Patent: May 11, 2021

(54) IMAGING DEVICE AND ELECTRONIC DEVICE

(71) Applicant: SONY SEMICONDUCTOR SOLUTIONS CORPORATION, Kanagawa (JP)

(72) Inventors: Yasunori Tsukuda, Kanagawa (JP); Noam Eshel, Pardesia (IL)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 192 days.

(21) Appl. No.: 16/307,250

(22) PCT Filed: Jun. 7, 2017

(86) PCT No.: PCT/JP2017/021194
§ 371 (c)(1),
(2) Date: Dec. 5, 2018

(87) PCT Pub. No.: WO2017/221715
PCT Pub. Date: Dec. 28, 2017

(65) Prior Publication Data
US 2020/0314368 A1    Oct. 1, 2020

(30) Foreign Application Priority Data

Jun. 21, 2016 (JP) .............................. JP2016-122532

(51) Int. Cl.
*H04N 5/359* (2011.01)
*H04N 5/369* (2011.01)
(Continued)

(52) U.S. Cl.
CPC ............. *H04N 5/359* (2013.01); *H04N 5/363* (2013.01); *H04N 5/378* (2013.01); *H04N 5/379* (2018.08)

(58) Field of Classification Search
None
See application file for complete search history.

(56) References Cited

U.S. PATENT DOCUMENTS

2008/0055432 A1* 3/2008 Koseki ................ H04N 5/3658
348/241
2009/0009635 A1 1/2009 Maeda et al.
(Continued)

FOREIGN PATENT DOCUMENTS

JP   2000-287131 A   10/2000
JP   2008-283557 A   11/2008
(Continued)

OTHER PUBLICATIONS

International Search Report and Written Opinion of PCT Application No. PCT/JP2017/021194, dated Aug. 8, 2017, 02 pages of translation and 09 pages of ISRWO.

*Primary Examiner* — James M Hannett
(74) *Attorney, Agent, or Firm* — Chip Law Group

(57) ABSTRACT

The present disclosure relates to an imaging device and an electronic device capable of restricting an occurrence of a sunspot phenomenon in a simple configuration. The imaging device includes a sample/hold part that samples and holds a reset voltage as a reset level voltage of a pixel signal and an AD conversion part that analog digital (AD) converts the pixel signal, in which the AD conversion part selects and outputs one of a first output signal as the AD converted pixel signal and a second output signal at a predetermined level on the basis of a comparison result between the reset voltage held by the sample/hold part and a predetermined reference voltage. The technology according to the present disclosure can be applied to a CMOS image sensor, for example.

20 Claims, 22 Drawing Sheets

(51) Int. Cl.
*H04N 5/363* (2011.01)
*H04N 5/378* (2011.01)

(56) References Cited

U.S. PATENT DOCUMENTS

| | | | |
|---|---|---|---|
| 2012/0008032 A1 | 1/2012 | Kurihara et al. | |
| 2012/0235021 A1* | 9/2012 | Kasai | H04N 5/3559 |
| | | | 250/208.1 |
| 2014/0313385 A1* | 10/2014 | Sato | H04N 5/3765 |
| | | | 348/302 |
| 2015/0189214 A1 | 7/2015 | Kurose | |
| 2015/0195472 A1 | 7/2015 | Ishii | |
| 2015/0249797 A1* | 9/2015 | Yui | H04N 5/3575 |
| | | | 250/208.1 |
| 2017/0013221 A1* | 1/2017 | Yanagida | H04N 5/3532 |

FOREIGN PATENT DOCUMENTS

| | | |
|---|---|---|
| JP | 2009-267970 A | 11/2009 |
| JP | 2012-010055 A | 1/2012 |
| JP | 2015-126043 A | 7/2015 |
| WO | 2014/049901 A1 | 4/2014 |
| WO | 2014/065223 A1 | 5/2014 |

\* cited by examiner

IMAGING DEVICE AND ELECTRONIC DEVICE

CROSS REFERENCE TO RELATED APPLICATIONS

This application is a U.S. National Phase of International Patent Application No. PCT/JP2017/021194 filed on Jun. 7, 2017, which claims priority benefit of Japanese Patent Application No. JP 2016-122532 filed in the Japan Patent Office on Jun. 21, 2016. Each of the above-referenced applications is hereby incorporated herein by reference in its entirety.

TECHNICAL FIELD

The technology according to the present disclosure relates to an imaging device and an electronic device, and particularly to an imaging device and an electronic device for restricting an occurrence of a sunspot phenomenon.

BACKGROUND ART

There has been conventionally discussed a technology for restricting an occurrence of a sunspot phenomenon in an imaging device such as CMOS image sensor. The sunspot phenomenon is a phenomenon in which charges leak from a photoelectric conversion device on a reset operation in a pixel in which a remarkably strong light is incident so that luminance lowers and a black precipitate is caused, which is called blackening phenomenon, black level depression, or blocked-up shadow.

Additionally, a state in which charges leak from a photoelectric conversion device on a reset operation in a pixel in which a strong light is incident and a sunspot phenomenon can occur will be called sunspot state below.

For example, according to the technology described in Patent Document 1, the presence of an occurrence of a sunspot phenomenon is detected on the basis of a comparison result between a voltage of a feedthrough part in a pixel signal and a predetermined reference potential. On the other hand, a pixel signal is delayed by a time required for detecting the presence of an occurrence of a sunspot state, a voltage of a feedthrough part in a pixel signal is sampled in a pixel where a sunspot state does not occur, and a voltage of a reset step part in a pixel signal when a reset gate is switched on is sampled in a pixel where a sunspot state occurs. Then, a voltage obtained by adding an average value of the pixel signals in a light shielded region to a sampled voltage is used as a reset level voltage of a pixel signal. Thereby, a reduction in reset level voltage in a pixel where a sunspot state occurs is prevented, and an occurrence of a sunspot phenomenon is restricted.

CITATION LIST

Patent Document

Patent Document 1: Japanese Patent Application Laid-Open No. 2009-267970

SUMMARY OF THE INVENTION

Problems to be Solved by the Invention

However, with the technology described in Patent Document 1, a sunspot state detection circuit, an image signal delay circuit, a circuit configured to generate a reset level voltage, and the like are required, and a circuit size increases.

The technology according to the present disclosure is therefore directed for restricting an occurrence of a sunspot phenomenon in a simple configuration.

Solutions to Problems

An imaging device of a first aspect of the technology according to the present disclosure includes: a sample/hold part configured to sample and hold a reset voltage as a reset level voltage of a pixel signal; and an AD conversion part configured to analog digital (AD) convert the pixel signal, in which the AD conversion part selects and outputs one of a first output signal as the AD converted pixel signal and a second output signal at a predetermined level on the basis of a comparison result between the reset voltage held by the sample/hold part and a predetermined reference voltage.

The sample/hold part can output a comparison signal indicating a comparison result between the held reset voltage and the reference voltage, and the AD conversion part can select and output one of the first output signal and the second output signal on the basis of the comparison signal.

The sample/hold part is provided with a circuit configured to switch on or off the inputs of a reference signal indicating the reference voltage and the pixel signal, can switch on an input of the reference signal in a state where the reset voltage is being held, and can output an output signal a voltage of which varies depending on a magnitude relationship between the held reset voltage and the reference voltage as the comparison signal.

The sample/hold part switches off an input of the reference signal after outputting the comparison signal, and then can output the reset voltage.

The sample/hold part can switch on an input of the reference signal in a state where the reset voltage is being held while settling a data voltage as a data level voltage of the pixel signal, and can output the comparison signal.

A delay part configured to delay the comparison signal by a predetermined time and to supply the delayed comparison signal to the AD conversion part can be provided.

A comparison part configured to output a comparison signal indicating a comparison result between the reset voltage output from the sample/hold part and the reference voltage is further provided, and the AD convert part can select and output one of the first output signal and the second output signal on the basis of the comparison signal.

A delay part configured to delay the comparison signal by a predetermined time and to supply the delayed comparison signal to the AD conversion part can be provided.

The sample/hold part can output the held reset voltage while settling a data voltage as a data level voltage of the pixel signal, and the comparison part can compare the reset voltage output from the sample/hold part with the reference voltage, and can output the comparison signal.

A kTC cancel part configured to reduce kTC noises in the sample/hold part can be provided.

The kTC cancel part accumulates charges corresponding to a variance of an output voltage of the sample/hold part due to the kTC noises, and can feedback the charges to the sample/hold part to reduce the kTC noises.

The reference voltage can be set at a voltage obtained by adding a voltage with a difference between a maximum value and a minimum value of an input voltage at which the AD conversion part normally operates or more to a limit voltage as a minimum value in a voltage range at which AD conversion can be normally performed in a vertical signal line configured to transfer the pixel signal.

A reference voltage generation part configured to generate and output the reference voltage can be further provided.

The reference voltage generation part can set the reference voltage on the basis of a detection result of the limit voltage.

The reference voltage generation part can generate and output the reference voltage at a preset level.

The first output signal can be a signal based on a difference between the reset voltage output from the sample/hold part and a data voltage as a data level voltage of the pixel signal.

The second output signal can be a signal at the highest luminance level.

A plurality of sample/hold parts are connected to the vertical signal lines configured to transfer the pixel signal, respectively, and one or more of the plurality of sample/hold parts can sample and hold the reset voltage.

A first substrate on which a pixel configured to output the pixel signal is provided and a second substrate on which the sample/hold part is provided can be laminated.

An electronic device of a second aspect of the technology according to the present disclosure includes: an imaging device; and a signal processing part configured to process a signal output from the imaging device, in which the imaging device includes: a sample/hold part configured to sample and hold a reset voltage as a reset level voltage of a pixel signal; and an AD conversion part configured to analog digital (AD) convert the pixel signal, and the AD conversion part selects and outputs one of a first output signal as the AD converted pixel signal and a second output signal at a predetermined level on the basis of a comparison result between the reset voltage held by the sample/hold part and a predetermined reference voltage.

According to the first aspect or the second aspect of the technology according to the present disclosure, a reset voltage as a reset level voltage of a pixel signal is sampled and held, and one of a first output signal as the AD converted pixel signal and a second output signal at a predetermined level is selected and output on the basis of a comparison result between the held reset voltage and a predetermined reference voltage.

Effects of the Invention

According to the first aspect or the second aspect of the technology according to the present disclosure, it is possible to restrict an occurrence of a sunspot phenomenon. Further, according to the first aspect or the second aspect of the technology according to the present disclosure, it is possible to restrict an occurrence of a sunspot phenomenon in a simple configuration.

Additionally, the effects described herein are not restrictive, and may be any effect described in the present disclosure.

MODE FOR CARRYING OUT THE INVENTION

Modes (denoted as "embodiments" below) for carrying out the invention will be described below in detail with reference to the drawings. Additionally, the description will be made in the following order.

1. First embodiment (example of comparison between reset voltage and reference voltage outside sample/hold circuit)
2. Second embodiment (example where first embodiment is provided with kTC cancel circuit)
3. Third embodiment (example of comparison between reset voltage and reference voltage inside sample/hold circuit)
4. Fourth embodiment (example where third embodiment is provided with kTC cancel circuit)
5. Variants
6. Exemplary applications 1. First Embodiment A first embodiment of the technology according to the present disclosure will be first described with reference to FIGS. 1, 2A, 2B, 2C, 3, 4, 5, and 6.

<1-1. Exemplary Configuration of Imaging Device>

Figure 1:
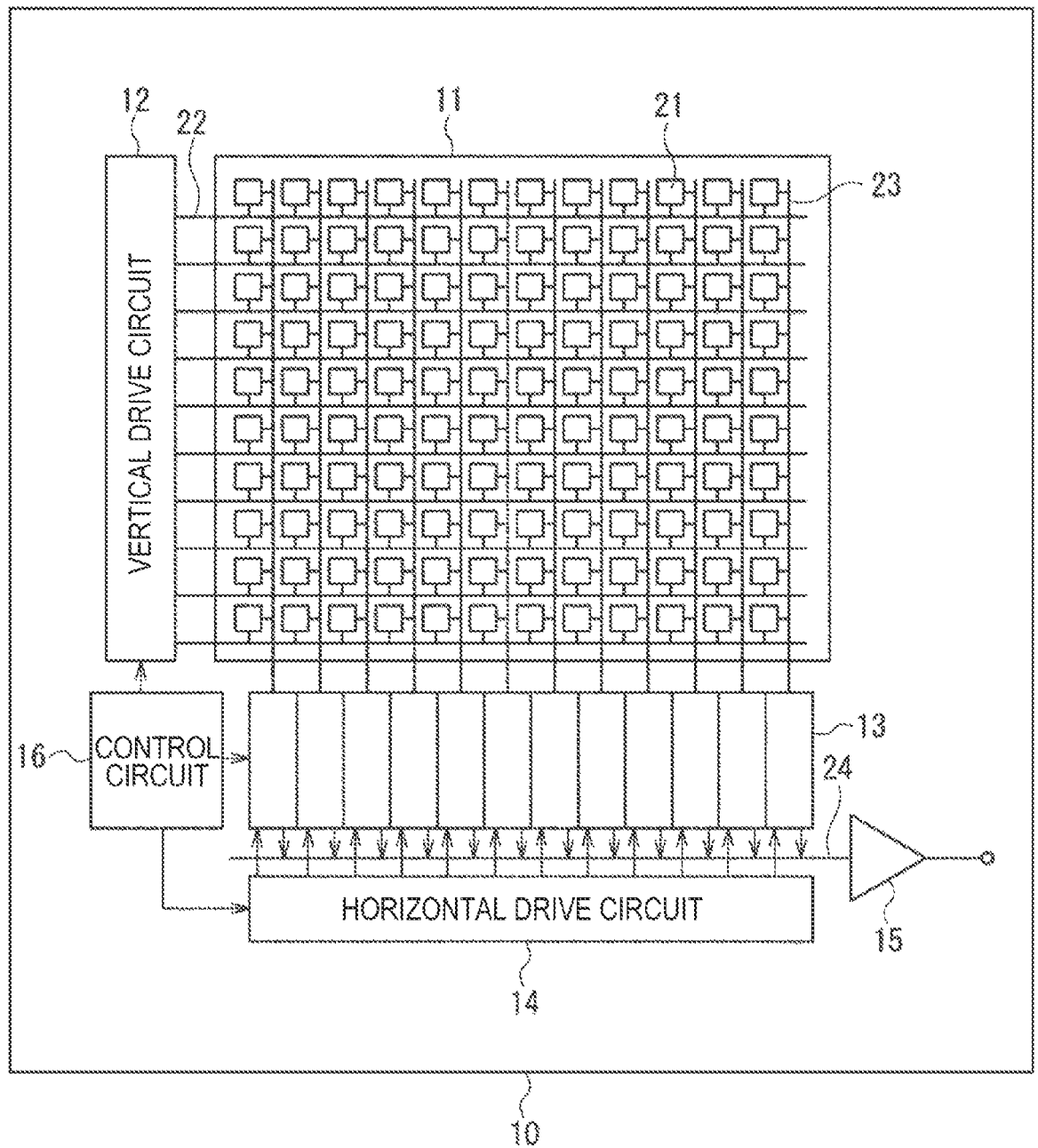
FIG. 1 is a diagram illustrating an exemplary configuration of an imaging device to which the technology according to the present disclosure is applied.

FIG. 1 is a block diagram illustrating an exemplary configuration of an imaging device 10 to which the technology according to the present disclosure is applied.

The imaging device 10 includes a pixel region 11, a vertical drive circuit 12, column signal processing circuits 13, a horizontal drive circuit 14, an output circuit 15, and a control circuit 16.

The pixel region 11 is a light receiving face configured to receive a light collected by an optical system (not illustrated). A plurality of pixels 21 are arranged in a matrix shape in the pixel region 11, and the respective pixels 21 are connected to the vertical drive circuit 12 per row via horizontal signal lines 22, and are connected to the column signal processing circuits 13 per column via vertical signal lines 23. The plurality of pixels 21 output pixel signals at levels depending on the amounts of received light, respectively, and an image of an object to be formed on the pixel region 11 is constructed from the pixel signals.

The vertical drive circuit 12 supplies drive signals for driving (transferring, selecting, resetting, and the like) the respective pixels 21 to the pixels 21 via the horizontal signal lines 22 sequentially per row of the plurality of pixels 21 arranged in the pixel region 11. For example, the vertical drive circuit 12 controls an exposure time, reading and scanning, and the like of each pixel 21 in the pixel region 11. Further, for example, the vertical drive circuit 12 reads and scans the plurality of pixel signals of the respective pixels 21 in the pixel region 11 in parallel, and controls a timing to move between rows to be read for reading and scanning on the basis of the positions of other rows to be read for reading and scanning as described below.

The column signal processing circuits 13 perform a correlated double sampling (CDS) processing on the pixel signals output from the plurality of pixels 21 via the vertical signal lines 23 thereby to AD convert the pixel signals and to cancel reset noises. For example, the column signal processing circuits 13 include a plurality of column processing parts (not illustrated) depending on the number of columns of the pixels 21, and can perform the CDS processing per column of the pixels 21 in parallel.

The horizontal drive circuit 14 supplies drive signals for causing the column signal processing circuits 13 to output pixel signals to an output signal line 24 to the column signal processing circuits 13 sequentially per column of the plurality of pixels 21 arranged in the pixel region 11.

The output circuit 15 amplifies the pixel signals supplied from the column signal processing circuits 13 via the output signal line 24 at timings according to the drive signals of the horizontal drive circuit 14, and outputs the amplified pixel signals to a subsequent signal processing circuit.

The control circuit 16 controls driving of each part in the imaging device 10. For example, the control circuit 16 generates a clock signal according to a drive cycle of each part, and supplies it to the part.

A substrate configuration of the imaging device 10 of FIG. 1 will be described below with reference to FIGS. 2A, 2B, and 2C. Additionally, the parts corresponding to those in FIG. 1 are denoted with the same reference numerals in the Figure.

Figure 2A:
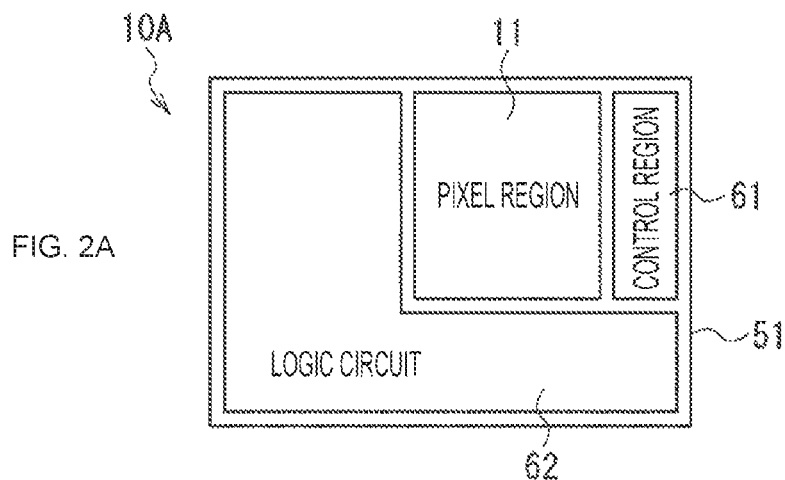
FIGS. 2A, 2B, and 2C are diagrams illustrating exemplary substrate configurations of the imaging device of FIG. 1.

FIG. 2A illustrates a first substrate configuration of an imaging device 10A. In the imaging device 10 in FIG. 2A, the pixel region 11, a control region 61, and a logic circuit 62 configured to perform a signal processing are provided on one semiconductor substrate 51. The vertical drive circuit 12, the column signal processing circuits 13, the horizontal drive circuit 14, the output circuit 15, and the control circuit 16 of FIG. 1 are provided in the control region 61, for example.

Figure 2B:
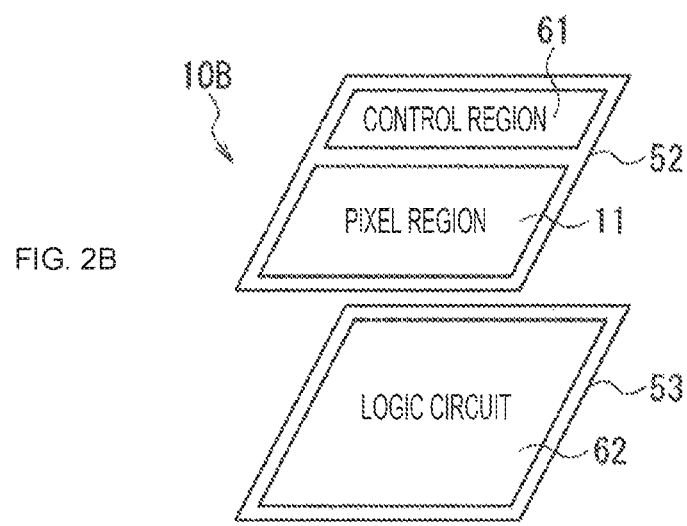
Figure 2C:
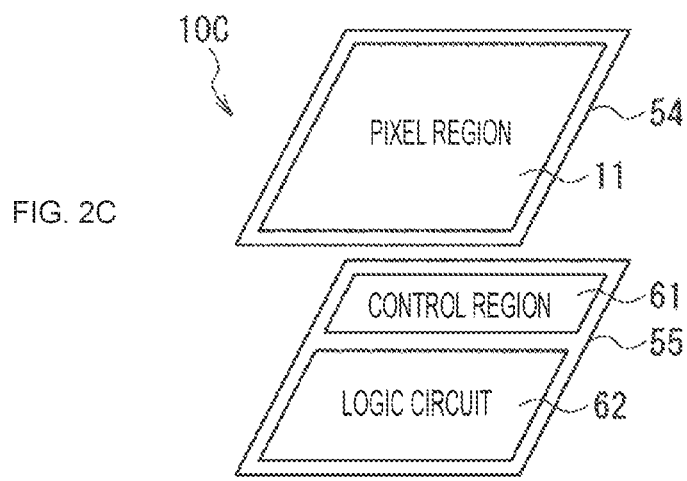

FIG. 2B and FIG. 2C illustrate second and third substrate configurations of the imaging device 10. An imaging device 10B in FIG. 2B and an imaging device 10C in FIG. 2C have such a structure that the pixel region 11 and the logic circuit 62 are formed on different semiconductor substrates and the semiconductor substrates are laminated.

In the imaging device 10B, the pixel region 11 and the control region 61 are provided on a first semiconductor substrate 52, and the logic circuit 62 including a signal processing circuit configured to perform a signal processing is provided on a second semiconductor substrate 53. The first semiconductor substrate 52 and the second semiconductor substrate 53 are electrically connected.

In the imaging device 10C, the pixel region 11 is provided on the first semiconductor substrate 52, and the control region 61 and the logic circuit 62 including a signal processing circuit are provided on the second semiconductor substrate 53. The first semiconductor substrate 52 and the second semiconductor substrate 53 are electrically connected.

A method for manufacturing a solid-state imaging apparatus in which the first semiconductor substrate 52 on which the pixel region 11 is formed and the second semiconductor substrate 53 on which the logic circuit 62 is formed are separately formed by use of a semiconductor process technology and are then laminated and electrically connected as in the imaging device 10B and the imaging device 10C is disclosed in Japanese Patent Application Laid-Open No. 2010-245506, Japanese Patent Application Laid-Open No. 2011-96851, and the like by the present applicants. The semiconductor substrates are separately formed and then laminated in this way, thereby contributing to higher image quality, higher productivity, and lower cost.

<1-2. Exemplary Configuration of Pixel>

Figure 3:
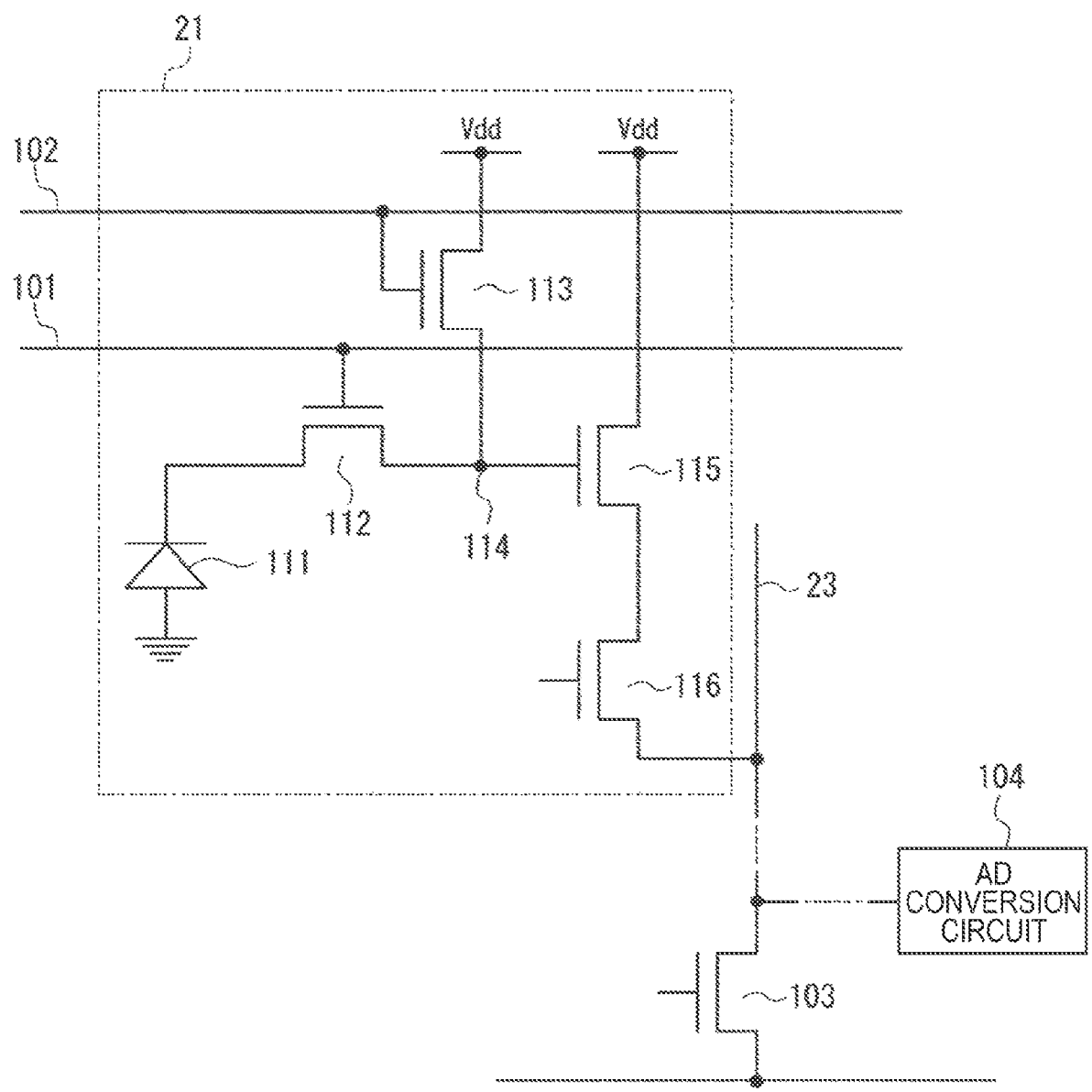
FIG. 3 is a circuit diagram illustrating an exemplary configuration of a pixel in the imaging device of FIG. 1.

FIG. 3 is a circuit diagram illustrating an exemplary configuration of each of the pixels 21 arranged in the pixel region 11 in the imaging device 10.

A pixel 21 includes a photoelectric conversion device 111, a transfer gate part 112, a reset gate part 113, a floating diffusion (FD) part 114, an amplification transistor 115, and a select transistor 116.

Further, a plurality of signal lines as the horizontal signal lines 22 of FIG. 1 are arranged for the pixels 21 per row of pixels, for example. Then, the drive signals TRG, RST, SEL, and OFG are supplied via the plurality of signal lines from the vertical drive circuit 12 of FIG. 1. Each transistor in the pixel 21 is an NMOS transistor, and thus the drive signals enter the active state in a high-level (such as power voltage Vdd) state and enter the non-active state in a low-level (such as ground level) state.

Additionally, FIG. 3 illustrates a transfer gate control line 101 and a reset gate control line 102 among the plurality of signal lines. The transfer gate control line 101 is used to transmit the drive signal TRG and the reset gate control line 102 is used to transmit the drive signal RST.

Additionally, in the following, "a drive signal enters the active state" will be denoted as "a driving signal is switched on" and "a drive signal enters the non-active state" will be denoted as "a drive signal is switched off."

The photoelectric conversion device 111 is configured of a PN-junction photodiode, for example. The photoelectric conversion device 111 generates and accumulates charges depending on the amount of received light.

The transfer gate part 112 is connected between the photoelectric conversion device 111 and the FD part 114. The drive signal TRG is applied to a gate electrode of the transfer gate part 112 via the transfer gate control line 101. When the drive signal TRG is switched on, the transfer gate part 112 enters conducted, and the charges accumulated in the photoelectric conversion device 111 are transferred to the FD part 114 via the transfer gate part 112.

The reset gate part 113 is connected between the power source Vdd and the FD part 114. The drive signal RST is applied to a gate electrode of the reset gate part 113 via the reset gate control line 102. When the drive signal RST is switched on, the reset gate part 113 enters conducted, and a potential of the FD part 114 is reset to the power voltage Vdd level.

The FD part 114 charge/voltage converts charges into a voltage signal, and outputs the voltage signal.

The amplification transistor 115 is connected at its gate electrode to the FD part 114, is connected at its drain electrode to the power source Vdd, and serves as a reading circuit configured to read charges held in the FD part 114, or an input part of a source follower circuit. That is, the amplification transistor 115 is connected at its source electrode to a vertical signal line 23 via the select transistor 116 thereby to configure the source follower circuit with a constant current source 103 connected to one end of the vertical signal line 23.

The select transistor 116 is connected between the source electrode of the amplification transistor 115 and the vertical signal line 23. The drive signal SEL is applied to a gate electrode of the select transistor 116. When the drive signal SEL is switched on, the select transistor 116 enters conducted and the pixel 21 enters selected. Thereby, a pixel signal output from the amplification transistor 115 is output to the vertical signal line 23 via the select transistor 116.

An AD conversion circuit 104 configured to AD convert a pixel signal is connected to the vertical signal line 23. Additionally, as described below, a sample/hold circuit and the like are connected between the vertical signal line 23 and the AD conversion circuit 104.

Additionally, "each gate part or each transistor enters conducted" will be denoted as "each gate part or each transistor is switched on" and "each gate part or each transistor enters non-conducted" will be denoted as "each gate part or each transistor is switched off."

<1-3. Sunspot Phenomenon>

Then, a sunspot phenomenon will be described below with reference to the timing chart of FIG. 4.

Figure 4:
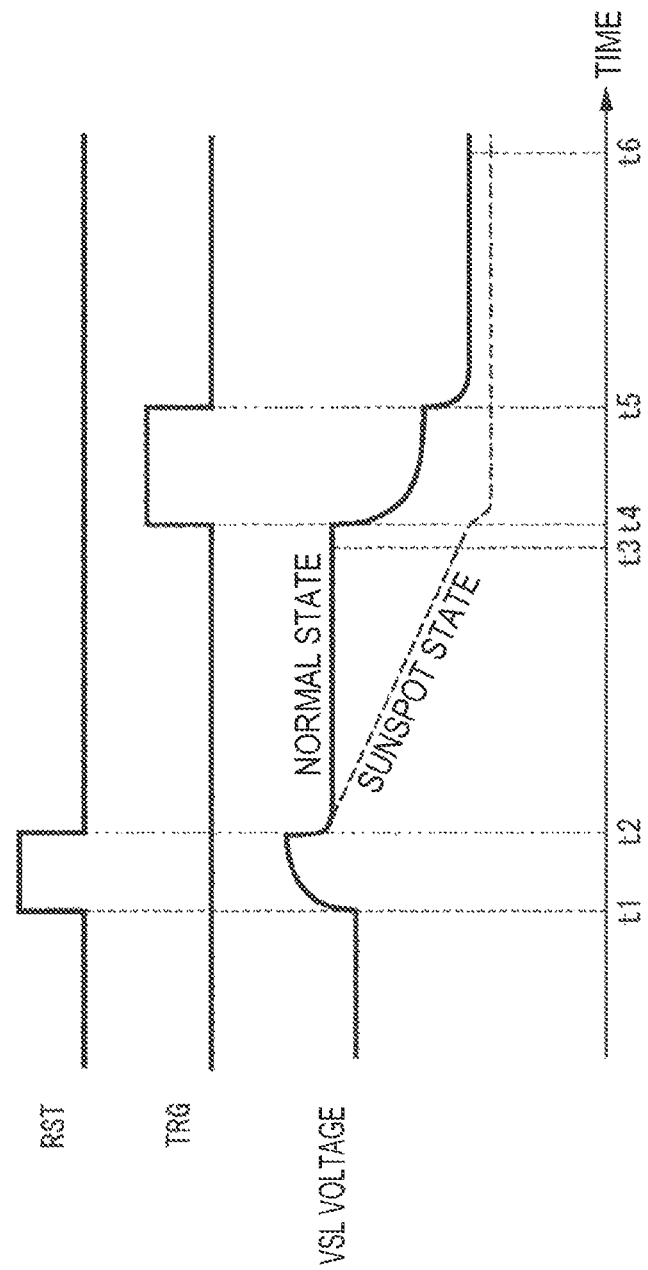
FIG. 4 is a timing chart for explaining a sunspot phenomenon.

The timing chart of FIG. 4 illustrates time-series transitions of the drive signal RST, the drive signal TRG, and a VSL voltage as a voltage of a vertical signal line 23 in a case where a pixel signal of a pixel 21 is sampled.

Additionally, though not illustrated in the timing chart of FIG. 4, it is assumed that when the drive signal SEL is switched on and the select transistor 116 is switched on for the pixel 21, the pixel 21 is in the selected state.

The drive signal RST is switched on and the reset gate part 113 is switched on at time t1. Thereby, the potential of the FD part 114 is reset to the power voltage Vdd. Accordingly, the VSL voltage increases to be a voltage corresponding to the power voltage Vdd.

Then, the drive signal RST is switched off and the reset gate part 113 is switched off at time t2. Thereby, the potential of the FD part 114 lowers to a feedthrough level. Accordingly, the VSL voltage lowers to a voltage corresponding to the feedthrough level (denoted as feedthrough voltage below).

Thereafter, the VSL voltage is kept almost equal to the feedthrough voltage in a normal state where a sunspot state does not occur.

On the other hand, when a remarkably strong light is incident in the pixel 21, charges overflow from the photoelectric conversion device 111 and a sunspot state occurs. That is, although the transfer gate part 112 is switched off, the charges overflowed from the photoelectric conversion device 111 flow into the FD part 114 and the potential of the FD part 114 lowers. Accordingly, the VSL voltage lowers.

Then, a reset level voltage (denoted as reset voltage below) of the pixel signal is sampled at time t3. At this time, the reset voltage more largely lowers in the sunspot state than in the normal state.

Then, the drive signal TRG is switched on and the transfer gate part 112 is switched on in the period between time t4 and time t5. Thereby, the charges accumulated in the photoelectric conversion device 111 are transferred to the FD part 114 via the transfer gate part 112.

At this time, the potential of the FD part 114 lowers by the charges transferred from the photoelectric conversion device 111 in the normal state, and accordingly the VSL voltage also lowers.

On the other hand, the potential of the FD part 114 is already lower at time t4 in the sunspot state than usual. Then, charges are further transferred from the photoelectric conversion device 111 to the FD part 114 so that the potential of the FD part 114 further lowers. Accordingly, the VSL voltage further lowers than usual.

Then, a data level voltage (denoted as data voltage below) of the pixel signal is sampled at time t6. At this time, in a case where a sunspot state occurs, the VSL voltage is much lower than the normal data voltage. Thus, a drain/source voltage of the constant current source 103 is lower than a voltage required for a saturated region operation. Therefore, the original data voltage cannot be obtained.

Consequently, for example, in a case where a pixel signal based on a difference between the reset voltage and the data voltage is generated by the CDS processing, the pixel signal is at low luminance (black level, for example) although the pixel signal should be, in principle, at high luminance (white level, for example) in the pixel where a sunspot state occurs.

A sunspot phenomenon occurs as described above.

<1-4. Exemplary Configuration of Signal Processing Part>

Figure 5:
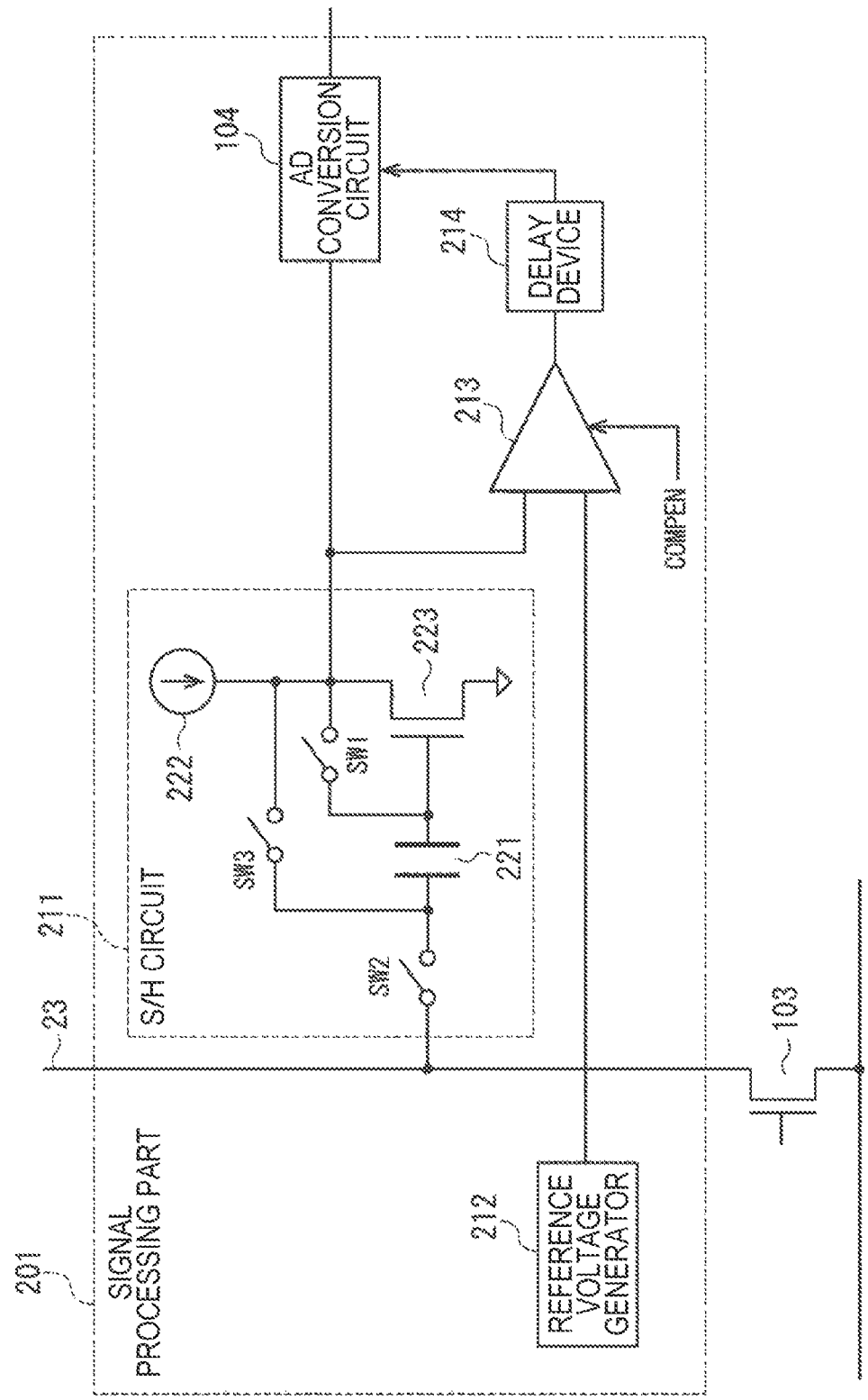
FIG. 5 is a diagram illustrating a first embodiment of a signal processing part in the imaging device of FIG. 1.

FIG. 5 illustrates an exemplary configuration of a circuit of a signal processing part 201 provided for a column signal processing circuit 13 in the imaging device 10 of FIG. 1. One signal processing part 201 is provided for each vertical signal line 23, for example.

The signal processing part 201 includes the AD conversion circuit 104, a sample/hold circuit 211, a reference voltage generator 212, a comparator 213, and a delay device 214.

The sample/hold circuit 211 includes a capacitor 221, a constant current source 222, a transistor 223 configured of an NMOS transistor, and switches SW1 to SW3.

One end of the capacitor 221 is connected to a vertical signal line 23 via the switch SW2, and the other end of the capacitor 221 is connected to a gate of the transistor 223. A drain of the transistor 223 is connected to the constant current source 222, the AD conversion circuit 104, and an input terminal of the comparator 213, and a source thereof is grounded. The switch SW1 is connected between the drain and the gate of the transistor 223. The switch SW3 is connected between the drain of the transistor 223 and one end of the capacitor 221 closer to the switch SW2.

The reference voltage generator 212 generates a predetermined reference voltage, and supplies a reference signal indicating the generated reference voltage to the input terminal of the comparator 213. Additionally, the reference voltage generator 212 is shared among a plurality of signal processing parts 201. That is, the reference signal is supplied from one reference voltage generator 212 to the comparators 213 in the signal processing parts 213 in a plurality of rows of the pixels. Thereby, the smaller area can be achieved. Additionally, a reference voltage generator 212 may be individually mounted on each signal processing part 201.

The comparator 213 compares an output voltage of the sample/hold circuit 211 with the reference voltage supplied from the reference voltage generator 212 thereby to determine a sunspot for determining the presence of an occurrence of a sunspot phenomenon. Specifically, the comparator 213 is supplied with a control signal COMPEN from the horizontal drive circuit 14, for example. The comparator 213 then compares the output voltage of the sample/hold circuit 211 with the reference voltage when the control signal COMPEN is switched on, and supplies a comparison signal indicating the comparison result to the delay device 214.

Additionally, it is assumed below that the comparison signal is set at High level in a case where the output voltage is the reference voltage or more and the comparison signal is set at Low level in a case where the output voltage is less than the reference voltage.

The delay device 214 delays the comparison signal supplied from the comparator 213 by a predetermined time, and supplies the delayed comparison signal to the AD conversion circuit 104.

The AD conversion circuit 104 AD converts the pixel signal on the basis of the output signal from the sample/hold circuit 211, and outputs the resultant digital pixel signal. Additionally, as described below, the AD conversion circuit 104 switches the value of the pixel signal on the basis of the comparison signal supplied from the delay device 214.

<1-5. Pixel Signal Sampling Processing>

A pixel signal sampling processing in the imaging device 10 will be described below with reference to the timing chart of FIG. 6.

Figure 6:
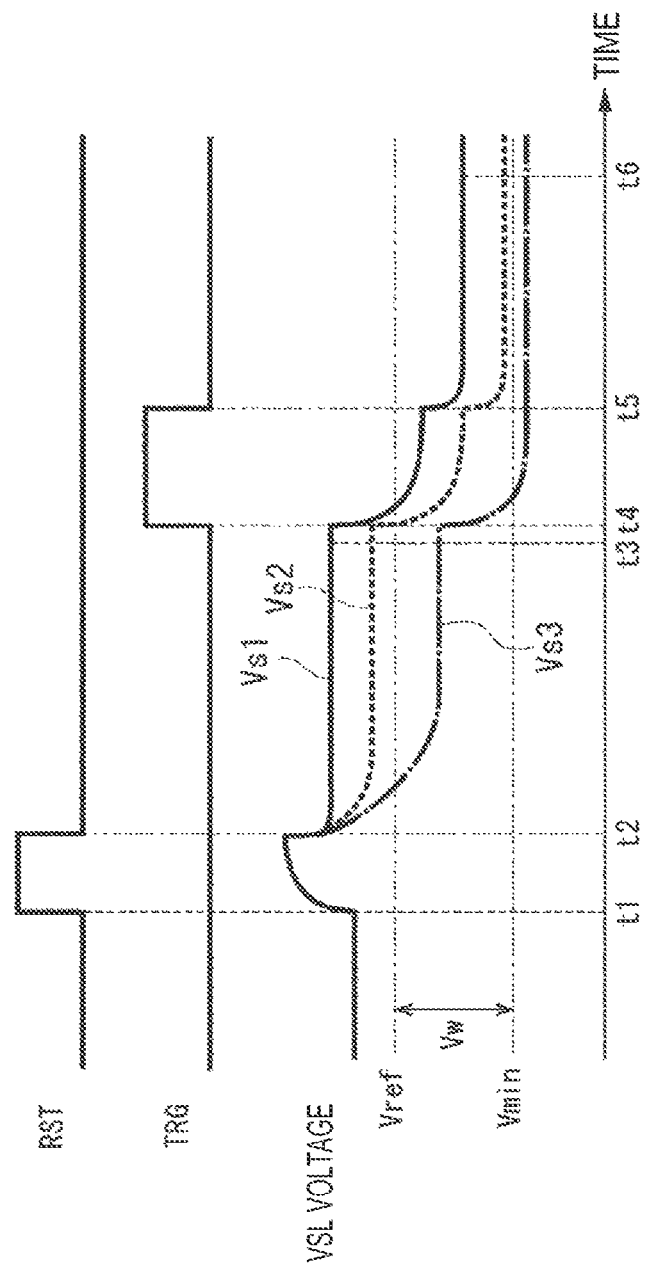
FIG. 6 is a timing chart for explaining a pixel signal sampling processing.

FIG. 6 illustrates a similar timing chart to FIG. 4. Further, the times corresponding to those in the timing chart of FIG. 4 indicate the same times in FIG. 6.

Further, FIG. 6 illustrates transitions of three kinds of VSL voltages including VSL voltage Vs1 to VSL voltage Vs3. For example, the VSL voltage Vs1 indicates a transition of a VSL voltage in a case where a sunspot state does not occur. The VSL voltage Vs2 indicates a transition of a VSL voltage in a case where a sunspot state does not occur but charges overflow from the photoelectric conversion device 111. The VSL voltage Vs3 indicates a transition of a VSL voltage in a case where a sunspot state occurs.

The processings from time t1 to time t2 are similar to the processings described above with reference to FIG. 4. That is, the FD part 114 is reset and the VSL voltage is set at the feedthrough voltage.

The reset voltage of the pixel signal is sampled at time t3. The reset voltage sampling processing will be described herein in detail with reference to the timing chart of FIG. 7.

Figure 7:
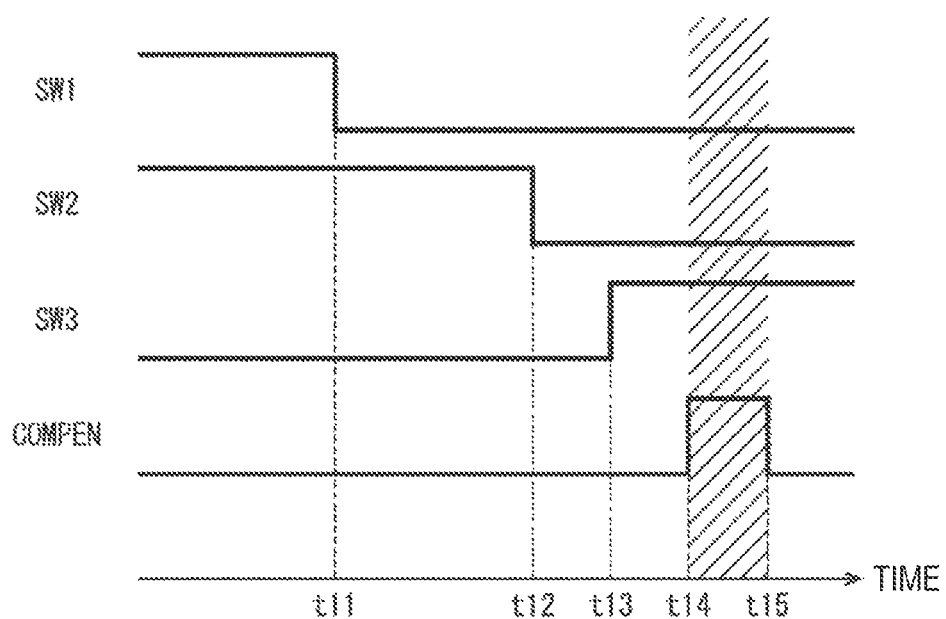
FIG. 7 is a timing chart for explaining the first embodiment of a reset voltage sampling processing.

The timing chart of FIG. 7 illustrates time-series transitions of the switches SW1 to SW3 of the signal processing part 201, and the control signal COMPEN.

Additionally, in the following, the reset voltage of a pixel signal, the data voltage of a pixel signal, and the reference voltage will be denoted as Vrst, Vdat, and Vref, respectively.

Further, a voltage between the terminals of the capacitor 221 will be denoted as capacitance voltage.

At first, the reset voltage Vrst is sampled. Specifically, the switch SW1 and the switch SW2 are switched on, and the switch SW3 is switched off. The switch SW1 is switched on so that the drain and the gate of the transistor 223 are short-circuited and the transistor 223 enters diode-connected. Thereby, the drain voltage and the gate voltage of the transistor 223 are almost equal, and are stabilized at predetermined voltages. The gate voltage at this time will be denoted as Vgs1 below.

Further, the output voltage of the sample/hold circuit 211 and the drain voltage of the transistor 223 are equal, and thus assuming the output voltage of the sample/hold circuit 211 at this time as Vout1, the output voltage Vout1 is almost equal to the gate voltage Vgs1.

Further, the reset voltage Vrst is applied to one end of the capacitor 221 closer to the switch SW2 via the switch SW2. Assuming a capacitance voltage of the capacitor 221 at this time as Vc1, the capacitance voltage Vc1 is expressed in the following Equation (1).

$$Vc1 = Vrst - Vgs1 \tag{1}$$

Then, the switch SW1 is switched off at time t11 and the switch SW2 is switched off at time t12. Even if the switch SW1 and the switch SW2 are switched off, the capacitance voltage of the capacitor 221 is kept at the voltage Vc1. The reset voltage Vrst is held as the capacitance voltage Vc1 of the capacitor 221 in this way.

Then, the switch SW3 is switched on at time t13. Assuming the output voltage of the sample/hold circuit 211 at this time as Vout2, the output voltage Vout2 is expressed in the following Equation (2).

$$\begin{aligned}Vout2 &= Vc1 + Vgs1 \\ &= (Vrst - Vgs1) + Vgs1 \\ &= Vrst\end{aligned} \tag{2}$$

The output voltage Vout2 of the sample/hold circuit 211 is equal to the reset voltage Vrst in this way. The reset voltage Vrst (=output voltage Vout2) is then input into the AD conversion circuit 104 and the comparator 213.

Then, the control signal COMPEN is switched on in the period between time t14 and time t15. Thereby, the comparator 213 compares the reset voltage Vrst with the reference voltage Vref thereby to determine a sunspot. In the case of reset voltage Vrst reference voltage Vref, the comparator 213 then determines that a sunspot state does not occur, and outputs a High-level comparison signal. On the other hand, in the case of reset voltage Vrst<reference voltage Vref, the comparator 213 determines that a sunspot state occurs, and outputs a Low-level comparison signal.

Here, as illustrated in FIG. 6, the reference voltage Vref is set at a value obtained by adding a voltage Vw to a limit voltage Vmin. The limit voltage Vmin is set at the minimum value in a range of the VSL voltage (voltage of a pixel signal) at which AD conversion can be normally performed. For example, the limit voltage Vmin is set at the highest voltage among the minimum value of the drain voltage at which the constant current source 103 can perform the saturation operation, the minimum permitted input voltage of the sample/hold circuit 211, and the minimum permitted input voltage of the AD conversion circuit 104. The voltage Vw is set at a voltage equal to or higher than a difference between the maximum value and the minimum value of the input voltage at which the AD conversion circuit 104 normally operates. That is, the voltage Vw is set at a full-scale input voltage or higher of the AD conversion circuit 104.

In the example of FIG. 6, the VSL voltage Vs1 and the VSL voltage Vs2 are higher than the reference voltage Vref at time t3 when the reset voltage Vrst is sampled, and thus the comparison signal is at High level. On the other hand, the VSL voltage Vs3 is lower than the reference voltage Vref at time t3, and the comparison signal is at Low level.

The processings from time t4 to time t5 are similar to the processings described above with reference to FIG. 4. That is, the drive signal TRG is switched on and the transfer gate part 112 is switched on so that the charges accumulated in the photoelectric conversion device 111 are transferred to the FD part 114 via the transfer gate part 112. Thereby, the potential of the FD part 114 lowers by the charges transferred from the photoelectric conversion device 111, and the VSL voltage also lowers.

The data voltage Vdat is sampled at time t6. For example, the sample/hold circuit 211 samples the data voltage Vdat in a similar method as for the reset voltage, and supplies the sampled data voltage Vdat to the AD conversion circuit 104.

Additionally, for example, a different sample/hold circuit from the sample/hold circuit 211 may be used to sample the data voltage Vdat.

Then, the AD conversion circuit 104 outputs a pixel signal at time t6 and after. Specifically, for example, the delay device 214 supplies a comparison signal to the AD conversion circuit 104 at a timing when the AD conversion circuit 104 outputs a pixel signal.

In a case where the comparison signal is at High level, or in the case of reset voltage Vrst reference voltage Vref, the AD conversion circuit 104 determines that a sunspot state does not occur, and outputs a digital signal having a value based on the difference between the data voltage Vdat and the reset voltage Vrst as a pixel signal. That is, the pixel signal AD converted in the normal CDS processing is generated and output. For example, a digital signal having a value based on the difference between the data voltage Vdat sampled at time t6 and the reset voltage Vrst sampled at time t3 is output as a pixel signal for the VSL voltage Vs1 and the VSL voltage Vs2.

On the other hand, in a case where the comparison signal is at Low level or in the case of reset voltage Vrst<reference voltage Vref, the AD conversion circuit 104 determines that a sunspot state occurs, and outputs a digital signal having a predetermined value as a pixel signal. For example, the AD conversion circuit 104 outputs a digital signal having a value corresponding to the highest luminance level as a pixel signal. For example, a digital signal having a predetermined value is output as a pixel signal for the VSL voltage Vs3 without the use of the data voltage Vdat and the reset voltage Vrst.

As described above, a low-luminance pixel signal is prevented from being output from a pixel where a sunspot state occurs, and an occurrence of a sunspot phenomenon is restricted. Consequently, a high-quality image can be obtained.

Further, a pixel signal does not need to be delayed for determining a sunspot as in the invention described in Patent Document 1 described above, thereby preventing a time required for the AD conversion from increasing. Consequently, a high-quality image can be obtained also during fast shooting.

Furthermore, it is possible to restrict an occurrence of a sunspot phenomenon in a simple configuration. For example, the imaging device 10 has only to be provided with the reference voltage generator 212, the comparator 213, and the delay device 214 in addition to the standard sample/hold circuit 211, and the pixel signal delay circuit, the sample/hold circuit configured to determine a sunspot, the circuit for generating a reset voltage, and the like are not required as in the invention described in Patent Document 1 described above. Consequently, an increase in circuit size can be prevented.

Further, according to the invention described in Patent Document 1 described above, a voltage of the reset step part in a pixel signal needs to be sampled when the reset gate is switched on, and accordingly a dynamic range of the sample/hold circuit or the like needs to be increased. On the other hand, the imaging device 10 does not need to increase such a dynamic range, and its circuit design is facilitated.

2. Second Embodiment

A second embodiment of the technology according to the present disclosure will be described below with reference to FIGS. 8 and 9.

The first embodiment has been described assuming that the reset voltage Vrst sampled in the sample/hold circuit 211 is equal to the output voltage Vout2 as expressed in the above Equation (2), but actually the reset voltage Vrst is not equal to the output voltage Vout2.

Specifically, when the switch SW1 is switched off at time t11 in FIG. 7, the gate voltage of the transistor 223 varies by ΔVgs due to an effect of kTC noise. Thus, the output voltage Vout2 when the switch SW3 is switched on at time t13 is strictly expressed not in the above Equation (2) but in the following Equation (3).

$$Vout2 = Vc1 + Vgs1 + \Delta Vgs \quad (3)$$
$$= (Vrst - Vgs1) + Vgs1 + \Delta Vgs$$
$$= Vrst + \Delta Vgs$$

A difference is caused between the output voltage Vout2 and the reset voltage Vrst in this way.

To the contrary, a solution to a reduction in effects of kTC noises is taken according to the second embodiment.

<2-1. Exemplary Configuration of Signal Processing Part>

Figure 8:
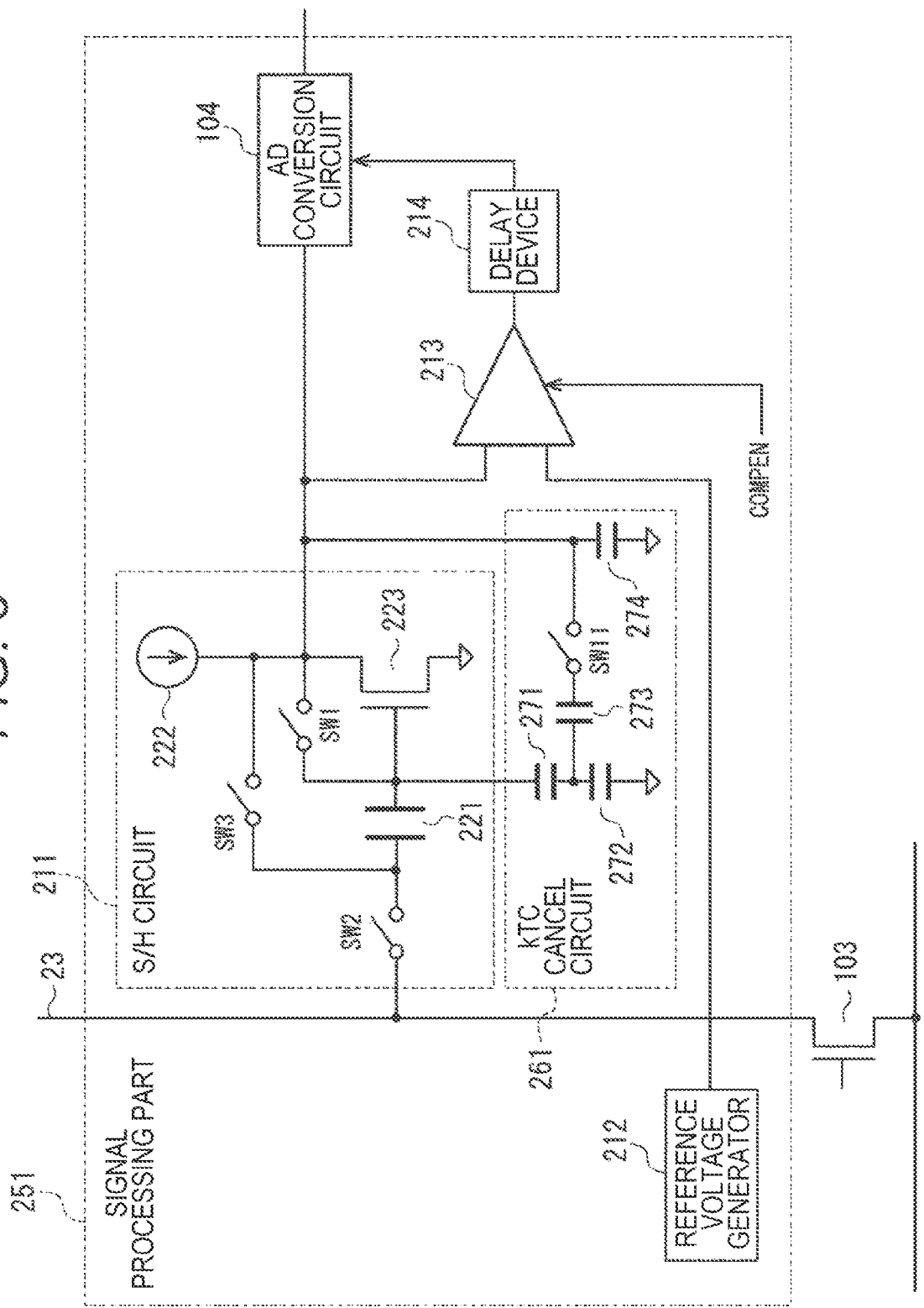
FIG. 8 is a diagram illustrating a second embodiment of a signal processing part in the imaging device of FIG. 1.

The second embodiment of the technology according to the present disclosure is different from the first embodiment in that signal processing parts 251 illustrated in FIG. 8 are provided in the imaging device 10 instead of the signal processing parts 201 of FIG. 5. Additionally, the parts corresponding to those in FIG. 5 are denoted with the same reference numerals in FIG. 8.

The signal processing part 251 is different from the signal processing part 201 in that a kTC cancel circuit 261 is provided.

The kTC cancel circuit 261 includes capacitor 271 to capacitor 274, and a switch SW11.

One end of the capacitor 271 is connected to the gate of the transistor 223, and the other end of the capacitor 271 is connected to one end of the capacitor 272 and one end of the capacitor 273. The other end of the capacitor 272, which is different from the end connected to the capacitor 271, is grounded. The other end of the capacitor 273, which is different from the end connected to the capacitor 271, is connected to the drain of the transistor 223 via the switch SW11. One end of the capacitor 274 is connected to the drain of the transistor 223, and the other end of the capacitor 274 is grounded.

<2-2. Processing of Sampling Reset Voltage Vrst>

The processings of the signal processing part 251 are different from the processings of the signal processing part 201 of FIG. 5 in the processing of sampling the reset voltage Vrst. The processing of sampling the reset voltage Vrst by the signal processing part 251 will be described herein with reference to the timing chart of FIG. 9.

Figure 9:
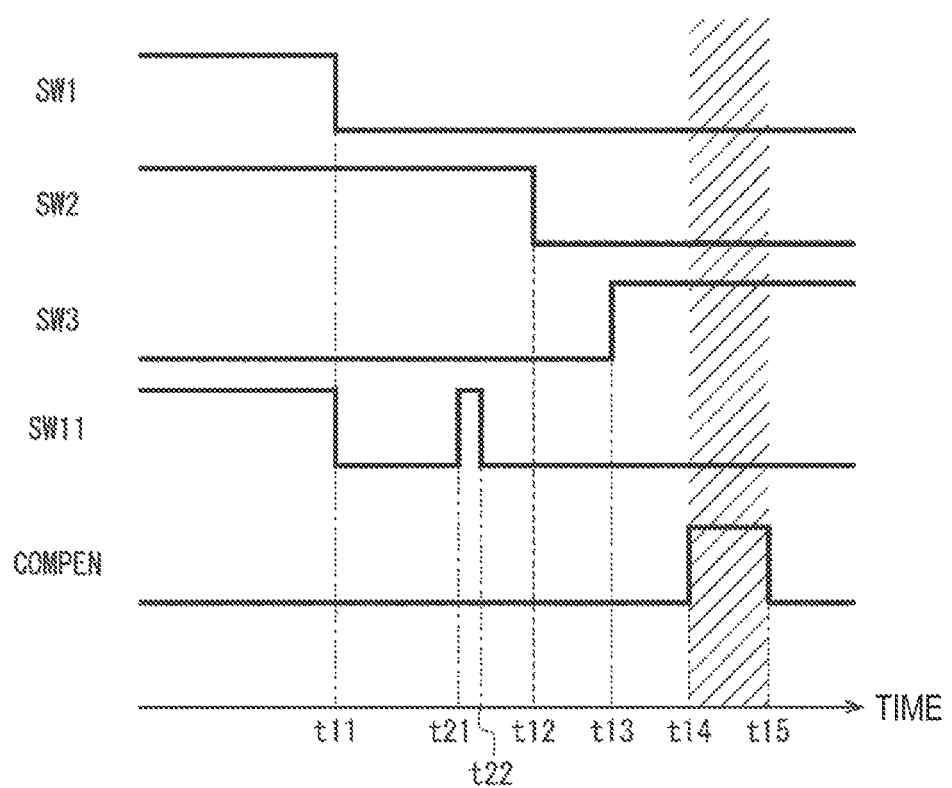
FIG. 9 is a timing chart for explaining the second embodiment of a reset voltage sampling processing.

FIG. 9 illustrates time-series transitions of the switch SW1 to the switch SW3 in the signal processing part 251, the switch SW11, and the control signal COMPEN. Additionally, the times corresponding to those in the timing chart of FIG. 7 indicate the same times in FIG. 9.

The timing chart of FIG. 9 is different from the timing chart of FIG. 7 in that the operations of the switch SW11 in the kTC cancel circuit 261 are added, and is similar thereto in the other points.

At first, the switch SW1 and the switch SW2 are switched on, the switch SW3 is switched off, and the reset voltage Vrst is sampled in the period until time t11 as in the period until time t11 in FIG. 7. Then, the output voltage Vout1 of the sample/hold circuit 211 is almost equal to the gate voltage Vgs1 of the transistor 223, and the capacitance voltage Vc1 of the capacitor 221 takes a value expressed in the above Equation (1). Further, the switch SW11 in the kTC cancel circuit 261 is switched on in the period.

The switch SW1 and the switch SW11 are switched off at time t11. The switch SW11 is switched off so that the voltages of the capacitor 271 to the capacitor 273 in the kTC cancel circuit 261 are defined while the output voltage of the sample/hold circuit 211 is at the voltage Vout1.

Additionally, the switch SW11 may be switched off earlier than the switch SW1.

Further, as described above, the gate voltage of the transistor 223 varies due to an effect of kTC noise. Assuming the gate voltage at this time as Vgs11, the gate voltage Vgs11 is expressed in the following Equation (4).

$$Vgs11 = Vgs1 + \Delta Vgs \quad (4)$$

Assuming the output voltage of the sample/hold circuit 211 at this time as Vout11, the output voltage Vout11 is expressed in the following Equation (5) and Equation (6).

$$Vout11 = Vout1 + \Delta Vout \quad (5)$$

$$\Delta Vout = \alpha \Delta Vgs \quad (6)$$

That is, the output voltage of the sample/hold circuit 211 varies by the voltage ΔVout before and after the switch SW1 is switched off. This is due to a variation in the drain voltage along with a variation in the gate voltage of the transistor 223.

Additionally, the coefficient α in Equation (6) is defined by transconductance of the transistor 223, or the like.

Then, the voltage Vout11 (=voltage Vout1+ΔVout) is applied to one end of the capacitor 274, and charges corresponding to the applied voltage are accumulated. On the other hand, the capacitance voltage of the capacitor 221 is kept at the voltage Vc1 in the above Equation (1).

Then, when the switch SW11 is switched on in the period between time t21 and time t22, part of the charges accumulated in the capacitor 274 flows into the capacitor 273. Thereby, a feedback path formed by the capacitor 271 to the capacitor 273 changes from the voltage defined while the output voltage of the sample/hold circuit 211 is at the voltage Vout1. Consequently, part of the voltage ΔVout as a difference between the voltage Vout11 and the voltage Vout11 is fed back via the feedback path, and a feedback voltage ΔVfb is applied to the gate of the transistor 223.

At this time, the capacitance of the capacitor 271 to the capacitor 274 is designed to meet the following Equation (7) so that the variance ΔVgs of the gate voltage of the transistor 223 is canceled. That is, charges corresponding to the variance ΔVout of the output voltage of the sample/hold circuit 211 due to kTC noise are accumulated in the capacitor 274 for a certain period, and then fed back to the sample/hold circuit 211 so that the variance ΔVgs of the gate voltage is canceled. Consequently, the gate voltage returns to the voltage Vgs1 before the switch SW1 is switched off.

$$\Delta Vfb = \Delta Vout/\alpha = -\Delta Vgs \quad (7)$$

Then, the switch SW3 is switched on at time t13. Assuming the output voltage of the sample/hold circuit 211 at this time as Vout12, the output voltage Vout12 is expressed in the following Equation (8).

$$Vout12 = Vc1 + Vgs1 \quad (8)$$
$$= (Vrst - Vgs1) + Vgs1$$
$$= Vrst$$

Thereafter, the similar processings to the processings at time t14 and time t15 in FIG. 7 are performed at time t14 and time t15.

As described above, kTC noises are reduced in the sample/hold circuit 211, and a voltage almost equal to the sampled reset voltage Vrst is output from the sample/hold circuit 211.

3. Third Embodiment

A third embodiment of the technology according to the present disclosure will be described below with reference to FIGS. 10 and 11.

<3-1. Exemplary Configuration of Signal Processing Part>

Figure 10:
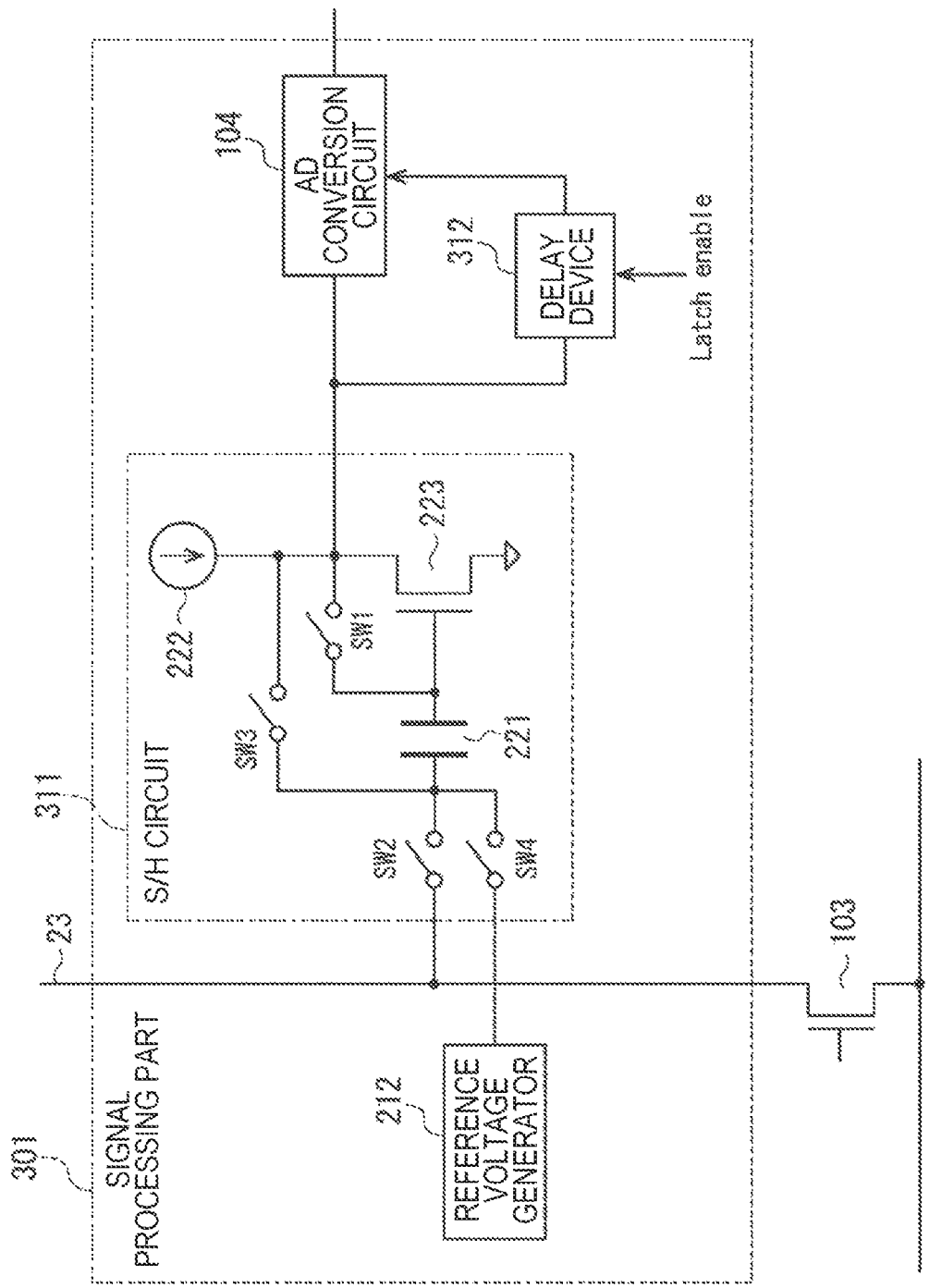
FIG. 10 is a diagram illustrating a third embodiment of a signal processing part in the imaging device of FIG. 1.

The third embodiment of the technology according to the present disclosure is different from the first embodiment in that signal processing parts 301 illustrated in FIG. 10 are provided in the imaging device 10 instead of the signal processing parts 201 of FIG. 5. Additionally, the parts corresponding to those in FIG. 5 are denoted with the same reference numerals in FIG. 10.

The signal processing part 301 is different from the signal processing part 201 in that a sample/hold circuit 311 and a delay device 312 are provided instead of the sample/hold circuit 211 and the delay device 214 and the comparator 213 independent of the sample/hold circuit 311 is not provided.

The sample/hold circuit 311 is different from the sample/hold circuit 211 in the signal processing part 201 in that a switch SW4 is added.

One end of the switch SW4 is connected to the reference voltage generator 212, and the other end of the switch SW4 is connected to one end of the capacitor 221 closer to the switch SW2. The switch SW2 and the switch SW4 then configure a circuit configured to switch on or off the inputs of a pixel signal from the vertical signal line 23 and a reference signal from the reference voltage generator 212. In other words, a circuit configured to select one of a pixel signal and a reference signal for an input signal into the sample/hold circuit 311 is configured.

Further, the drain of the transistor 223 is connected to the AD conversion circuit 104 and the delay device 312.

The delay device 312 is supplied with a control signal Latch Enable from the horizontal drive circuit 14, for example. The delay device 312 holds the voltage of the output signal of the sample/hold circuit 311 when being applied with the control signal Latch Enable, delays a signal indicting the held voltage by a predetermined time, and supplies the delayed signal to the AD conversion circuit 104.

<3-2. Pixel Signal Sampling Processing>

A pixel signal sampling processing by the imaging device 10 including the signal processing parts 301 will be described below with reference to the timing chart of FIG. 6 described above.

The processings from time t1 to time t2 are similar to the processings described above with reference to FIG. 4. That is, the FD part 114 is reset and the VSL voltage is set at the feedthrough voltage.

The reset voltage of the pixel signal is sampled at time t3. The reset voltage sampling processing will be described herein in detail with reference to the timing chart of FIG. 11.

Figure 11:
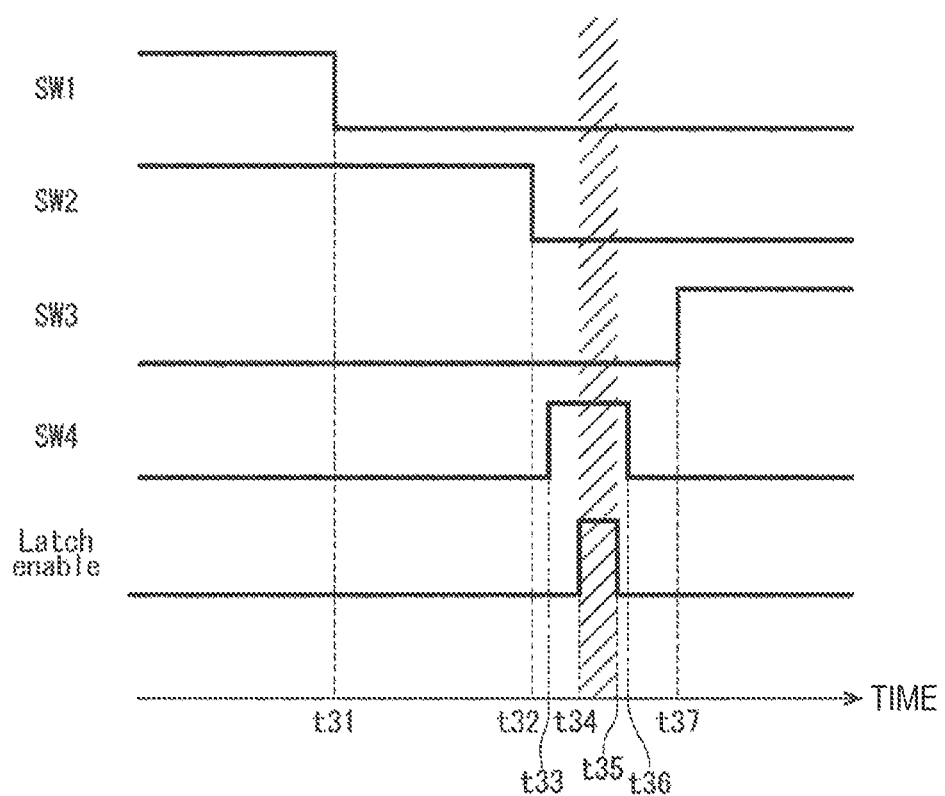
FIG. 11 is a timing chart for explaining the third embodiment of a reset voltage sampling processing.

The timing chart of FIG. 11 illustrates time-series transitions of the switch SW1 to the switch SW4 in the signal processing part 301 and the control signal Latch Enable.

At first, the reset voltage Vrst is sampled. Specifically, the switch SW1 and the switch SW2 are switched on and the switch SW3 is switched off. When the switch SW1 is switched on, the drain and the gate of the transistor 223 are short-circuited and the transistor 223 enters diode-connected. Thereby, the drain voltage and the gate voltage of the transistor 223 are almost equal, and are stabilized at predetermined voltages. The gate voltage at this time will be denoted as Vgs21 below.

Further, since the output voltage of the sample/hold circuit 211 is equal to the drain voltage of the transistor 223, assuming the output voltage of the sample/hold circuit 211 at this time as Vout21, the output voltage Vout21 is almost equal to the gate voltage Vgs21.

Further, the reset voltage Vrst is applied to one end of the capacitor 221 closer to the switch SW2 via the switch SW2. Assuming the capacitance voltage of the capacitor 221 at this time as Vc21, the capacitance voltage Vc21 is expressed in the following Equation (9).

$$Vc21 = Vrst - Vgs21 \quad (9)$$

Then, the switch SW1 is switched off at time t31, and the switch SW2 is switched off at time t32. Even if the switch SW1 and the switch SW2 are switched off, the capacitance voltage of the capacitor 221 is kept at the voltage Vc21. The reset voltage Vrst is held as the capacitance voltage Vc21 of the capacitor 221 in this way.

Then, the switch SW4 is switched on at time t33. Thereby, a reference signal indicating the reference voltage Vref is input into the sample/hold circuit 311 while the reset voltage Vrst is held. The reference voltage Vref is then applied to one end of the capacitor 221 closer to the switch SW2. Assuming the gate voltage at this time as Vgs22, the gate voltage Vgs22 takes a value expressed in the following Equation (10) since the capacitance voltage of the capacitor 221 is kept as it is.

$$Vgs22 = Vref - Vc21 \quad (10)$$
$$= Vref - (Vrst - Vgs21)$$
$$= Vgs21 + (Vref - Vrst)$$

Therefore, the gate voltage of the transistor 223 varies by reference voltage Vref−reset voltage Vrst.

Assuming the output voltage of the sample/hold circuit 211 at this time as Vout22, in the case of reset voltage Vrst>reference voltage Vref, the gate voltage of the transistor 223 lowers and thus the output voltage Vout22 increases. The output voltage Vout22 then approaches the voltage of the power source in the imaging device 10 (not illustrated).

On the other hand, in the case of reset voltage Vrst<reference voltage Vref, the gate voltage of the transistor 223 increases, and thus the output voltage Vout22 lowers. The output voltage Vout22 then approaches the ground level.

The output voltage Vout22 varies depending on the magnitude relationship between the reset voltage Vrst and the reference voltage Vref in this way. Therefore, an output signal indicating the output voltage Vout22 can be handled as a comparison signal indicating a comparison result between the reset voltage Vrst and the reference voltage Vref. That is, the comparison signal is larger than a predetermined threshold in the case of reset voltage Vrst>reference voltage Vref, and is smaller than the predetermined threshold in the case of reset voltage Vrst<reference voltage Vref.

The comparison signal indicating the output voltage Vout22 is then supplied from the sample/hold circuit 311 to the delay device 312.

Then, the control signal Latch Enable is applied from the horizontal drive circuit 14 to the delay device 312 in the period between time t34 and time t35. Thereby, the voltage (output voltage Vout22) of the comparison signal at this time is held by the delay device 312.

The switch SW4 is then switched off at time t36. At this time, the capacitance voltage of the capacitor 221 is held at the voltage Vc21, and the gate voltage of the transistor 223 is held at the voltage Vgs22.

The switch SW3 is then switched on at time t37. The switch SW3 is switched on so that the drain and the source of the transistor 223 are connected via the capacitor 221. Thereby, the gate voltage of the transistor 223 returns from the voltage Vgs22 to the voltage Vgs21 before the switch SW4 is switched on, and is stabilized. On the other hand, the capacitance voltage of the capacitor 221 is held at the voltage Vc21. Thus, assuming the output voltage of the sample/hold circuit 311 at this time as Vout23, the output voltage Vout23 is expressed in the following Equation (11).

$$Vout23 = Vc21 + Vgs21 \quad (11)$$
$$= (Vrst - Vgs21) + Vgs21$$
$$= Vrst$$

The output voltage Vout23 of the sample/hold circuit 311 is equal to the reset voltage Vrst in this way. The reset voltage Vrst (=output voltage Vout23) is then input into the AD conversion circuit 104.

Returning to FIG. 6, the processings from time t4 to time t5 are similar to the processings described above with reference to FIG. 4. That is, the drive signal TRG is switched on and the transfer gate part 112 is switched on so that the charges accumulated in the photoelectric conversion device 111 are transferred to the FD part 114 via the transfer gate part 112. Thereby, the potential of the FD part 114 lowers by the charges transferred from the photoelectric conversion device 111, and the VSL voltage also lowers.

The data voltage Vdat is sampled at time t6. For example, the sample/hold circuit 311 samples the data voltage Vdat in a similar method as for the reset voltage, and supplies the sampled data voltage Vdat to the AD conversion circuit 104. At this time, however, the switch SW4 does not need to be switched on and the reference signal does not need to be temporarily input into the sample/hold circuit 311 unlike in a case where the reset voltage Vrst is sampled.

Additionally, for example, a different sample/hold circuit from the sample/hold circuit 311 may be used to sample the data voltage Vdat.

The AD conversion circuit 104 then outputs a pixel signal at time t6 and after. Specifically, for example, the delay device 312 supplies the comparison signal (output voltage Vout22) to the AD conversion circuit 104 at a timing when the AD conversion circuit 104 outputs a pixel signal.

In a case where the comparison signal is at a predetermined threshold or more, or in the case of reset voltage Vrst reference voltage Vref, the AD conversion circuit 104 determines that a sunspot state does not occur, and outputs a digital signal having a value based on the difference between the data voltage Vdat and the reset voltage Vrst as a pixel signal. That is, a pixel signal AD converted in the normal CDS processing is generated and output.

On the other hand, in a case where the comparison signal is at less than the predetermined threshold, or in the case of reset voltage Vrst<reference voltage Vref, the AD conversion circuit 104 determines that a sunspot state occurs, and outputs a digital signal having a predetermined value as a pixel signal. For example, the AD conversion circuit 104 outputs a digital signal having a value corresponding to the highest luminance level as a pixel signal.

As described above, a low-luminance pixel signal is prevented from being output from a pixel where a sunspot state occurs, and an occurrence of a sunspot phenomenon is restricted.

Further, the signal processing part 301 can delete the comparator 213 and thus can further reduce the circuit size than the signal processing part 201 of FIG. 5. Furthermore, an offset of the comparator 213 does not need to be considered, and thus an accuracy of sunspot determination is improved.

4. Fourth Embodiment

A fourth embodiment of the technology according to the present disclosure will be described below with reference to FIGS. 12 to 13.

The third embodiment has been described assuming that the reset voltage Vrst sampled in the sample/hold circuit 311 is equal to the output voltage Vout23 as expressed in the above Equation (11), but actually the reset voltage Vrst is not equal to the output voltage Vout23 due to an effect of kTC noise as described above.

To the contrary, a solution to a reduction in effects of kTC noises is taken according to the fourth embodiment in a similar method to the second embodiment.

<4-1. Exemplary Configuration of Signal Processing Part>

Figure 12:
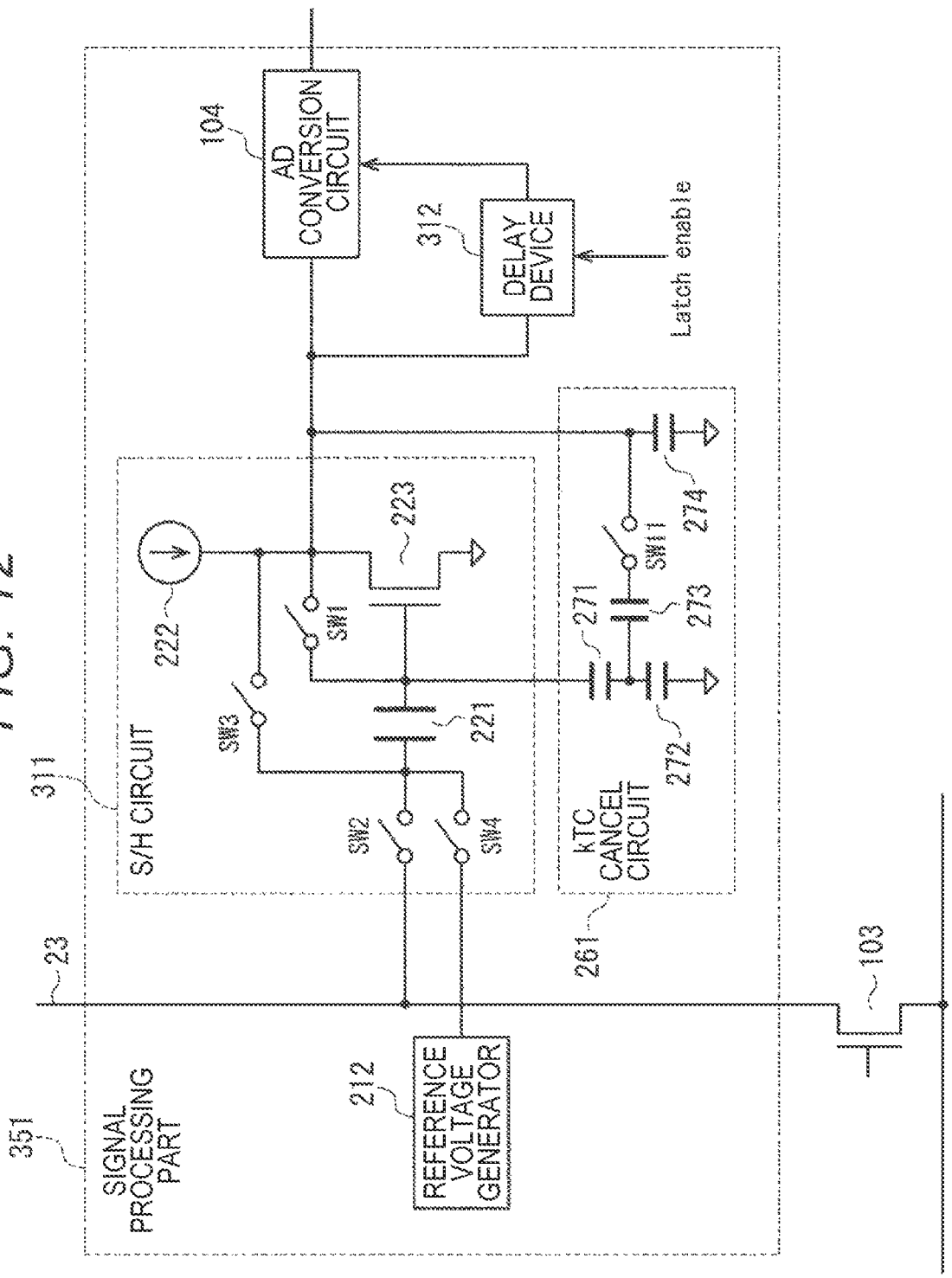
FIG. 12 is a diagram illustrating a fourth embodiment of a signal processing part in the imaging device of FIG. 1.

The fourth embodiment of the technology according to the present disclosure is different from the third embodiment in that signal processing parts 351 illustrated in FIG. 12 are provided in the imaging device 10 instead of the signal processing parts 301 of FIG. 10. Additionally, the parts corresponding to those in FIG. 8 and FIG. 10 are denoted with the same reference numerals in FIG. 12.

The signal processing part 351 is different from the signal processing part 301 in that the similar kTC cancel circuit 261 as in the signal processing part 251 of FIG. 8 is added. A connection position of the kTC cancel circuit 261 is similar to that of the signal processing part 251.

<4-2. Processing of Sampling Reset Voltage Vrst>

The processings of the signal processing part 351 are different from the processings of the signal processing part 301 of FIG. 10 in the processing of sampling the reset voltage Vrst. The processing of sampling the reset voltage Vrst by the signal processing part 351 will be described herein with reference to the timing chart of FIG. 13.

Figure 13:
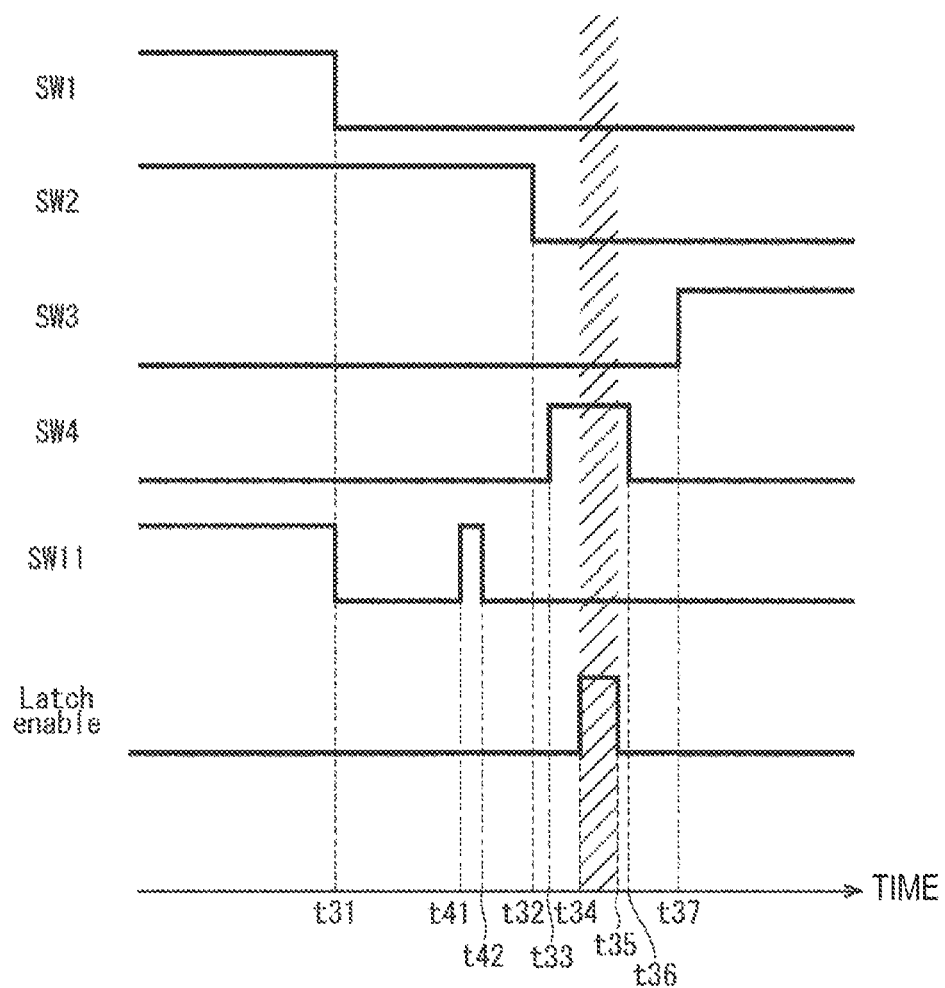
FIG. 13 is a timing chart for explaining the fourth embodiment of a reset voltage sampling processing.

FIG. 13 illustrates time-series transitions of the switch SW1 to the switch SW4 in the signal processing part 351, the switch SW11, and the control signal Latch Enable. Additionally, the times corresponding to those in the timing chart of FIG. 11 indicate the same times in FIG. 13.

The timing chart of FIG. 13 is different from the timing chart of FIG. 11 in that the operations of the switch SW11 in the kTC cancel circuit 261 are added, and is similar thereto in the other points.

Then, the switch SW11 is switched on in the period until time t31 and in the period between time t41 and time t42 similarly as in the second embodiment so that the variance of the gate voltage of the transistor 223 due to kTC noise is canceled by the kTC cancel circuit 261.

Thereby, kTC noises are reduced in the sample/hold circuit 311, and a voltage almost equal to the sampled reset voltage Vrst is output from the sample/hold circuit 311.

5. Variants

Variants of the embodiments of the technology according to the above-described present disclosure will be described below.

The exemplary configuration of the pixel 21 of FIG. 3 is exemplary, and the technology according to the present disclosure can use pixels in an arbitrary configuration.

Further, the number of sample/hold circuits is also exemplary, and there may be configured such that a plurality of sample/hold circuits are provided for the vertical signal lines 23, respectively, and one or more of them are configured of the sample/hold circuits 211 or the sample/hold circuits 311, for example.

Further, the above description has explained the example in which the AD conversion circuit 104 is provided per vertical signal line 23 to AD convert a pixel signal, but the AD conversion circuit 104 may be provided per block in a predetermined size in the pixel region 11, for example. In this case, at least one of the signal processing part 201, the signal processing part 251, the signal processing part 301, and the signal processing part 351 is provided in each block in the pixel region 11, for example.

Further, the technology according to the present disclosure is applicable in a case where a processing of generating a pixel signal on the basis of a difference between the data voltage and the reset voltage, such as a double data sampling (DDS) processing, is performed in addition to the CDS processing.

Further, for example, the sunspot determination does not necessarily need to be made immediately after the sample/hold circuit 211 or the sample/hold circuit 311 holds the reset voltage, and the sunspot determination may be made later as needed. For example, a pipeline processing of determining a sunspot while settling the data voltage of a pixel signal may be performed.

Figure 14:
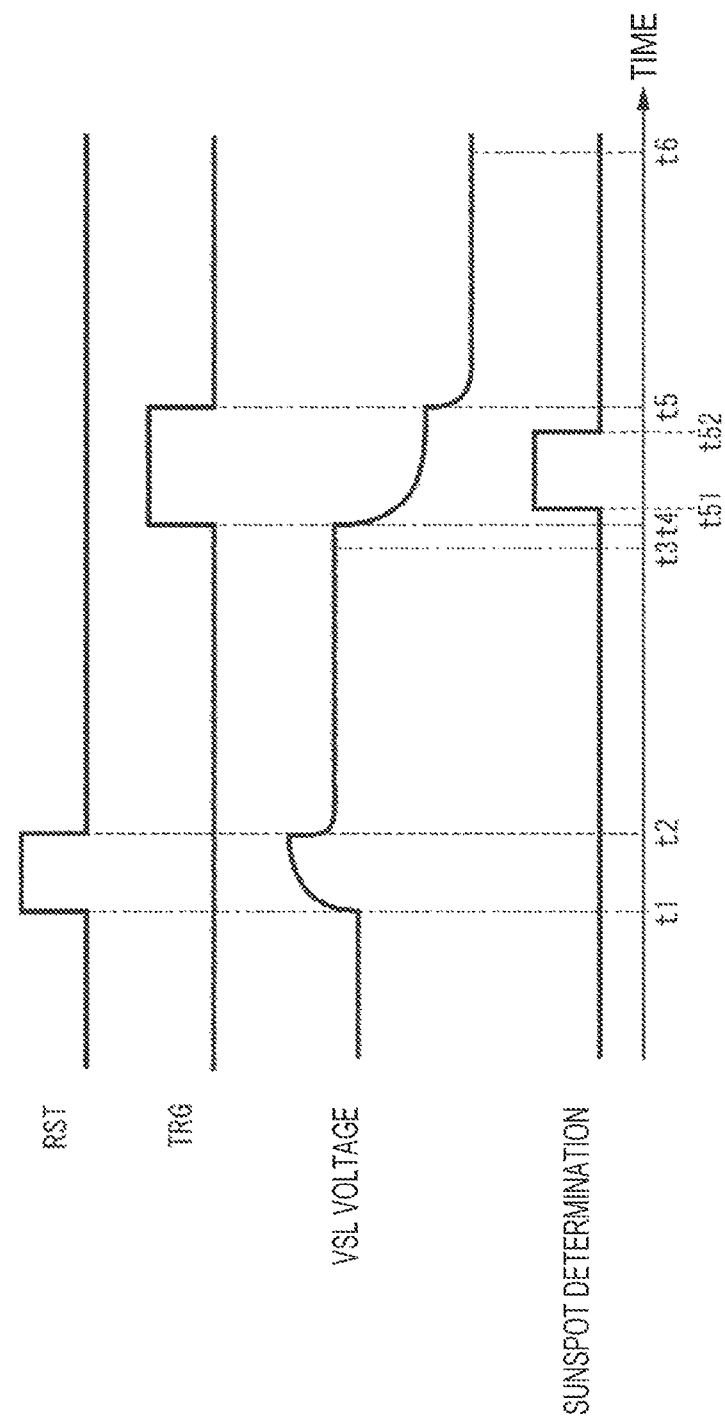
FIG. 14 is a timing chart for explaining a pipeline processing.

FIG. 14 illustrates a timing chart of the drive signal RST, the drive signal TRG, the VSL voltage, and the sunspot determination in a case where the pipeline processing is performed. Additionally, the times corresponding to those in the timing chart of FIG. 4 indicate the same times in FIG. 14.

As described above, at time t3, the reset voltage of the pixel signal is sampled and the reset voltage is held in the sample/hold circuit 211 or the sample/hold circuit 311. Thereafter, the drive signal TRG is switched on and the data voltage of the pixel signal is settled between time t4 and time t5. For example, the sunspot determination may be made between time t51 and time t52 in which the data voltage is being settled. Specifically, for example, the processings between time t13 and time t15 in FIG. 7 or FIG. 9 or the processings between t33 and time t36 in FIG. 11 or FIG. 13 may be performed between time t51 and time t52. Thereby, a waiting time for the sunspot determination can be reduced and a time required for the AD conversion processing can be reduced.

Additionally, the sunspot determination is made in the comparator 213 separate from the vertical signal line 23 via the switch SW2 and the switch SW3 across the circuit in the signal processing part 201 or the signal processing part 251. Therefore, a kickback noise due to the operation of comparing the reset voltage and the reference voltage is less likely to return to the vertical signal line 23, and a possibility that stabilization of the data voltage of the pixel signal is delayed is low.

Further, the reference voltage generated and output by the reference voltage generator 212 may be a fixed value or may be a variable value.

In a case where the reference voltage is a fixed value, the value of the reference voltage of the reference voltage generator 212 may be previously set by use of a register or the like, for example. Alternatively, for example, the above-described limit voltage Vmin is measured during production test or the like, and the reference voltage of the reference voltage generator 212 may be set on the basis of the measured value of the limit voltage Vmin.

On the other hand, in a case where the reference voltage is a variable value, the reference voltage generator 212 may set the reference voltage on the basis of a detection result of the limit voltage Vmin detected when the imaging device 10 is activated or at a predetermined timing while it is operating, for example.

6. Exemplary Applications

The technology according to the present disclosure can be applied to various products.

<6-1. Exemplary Application of Technology According to Present Disclosure>

Figure 15:
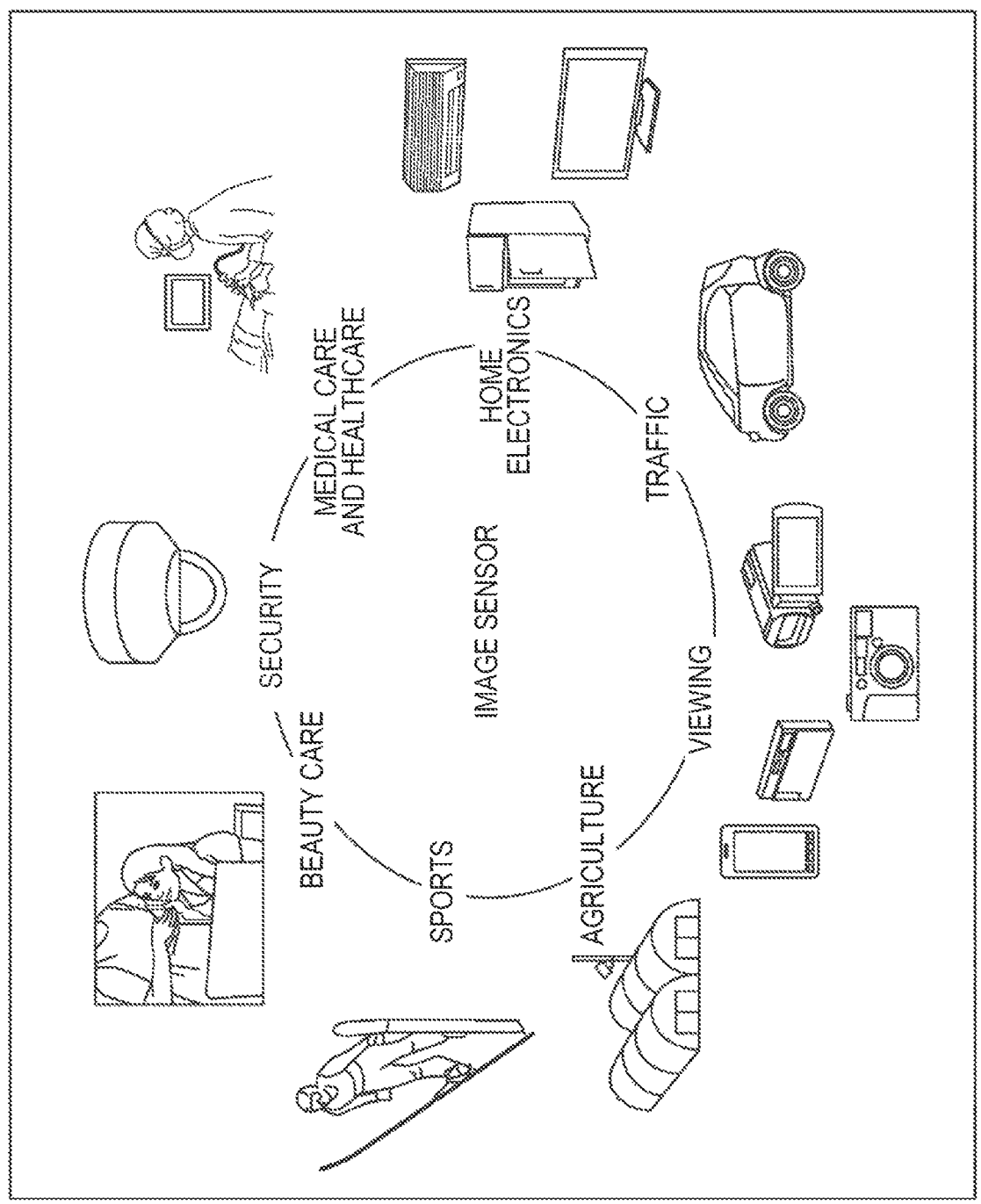
FIG. 15 is a diagram illustrating exemplary use of a solid-state imaging device.

For example, the technology according to the present disclosure can be applied to various cases for sensing a visible ray, an infrared ray, an ultraviolet ray, an X ray, and the like as illustrated in FIG. 15.

Apparatuses configured to shoot images to be viewed such as digital camera and portable device with camera function Traffic apparatuses for safe driving such as automatic stop or for driver's state recognition or the like such as vehicle-mounted sensor configured to shoot in front of, behind, around, inside, or the like of an automobile, monitoring camera configured to monitor traveling vehicles or roads, and distance measurement sensor configured to measure inter-vehicle distance or the like Apparatuses for home electronics such as TV, refrigerator, and air conditioner configured to shoot user's gesture and to operate a device according to the gesture.

Medical care or healthcare apparatuses such as endoscope and apparatus configured to perform angiography by received infrared ray Security apparatuses such as monitoring camera for crime prevention and camera for person authentication Beauty care apparatuses such as skin measurement device configured to shoot the skin and microscope configured to shoot the scalp Sports apparatuses such as action camera and wearable camera for sports or the like Agricultural apparatuses such as camera configured to monitor state of field or crops Exemplary applications will be described below more specifically.

<6-2. Exemplary Application to Electronic Device>

Figure 16:
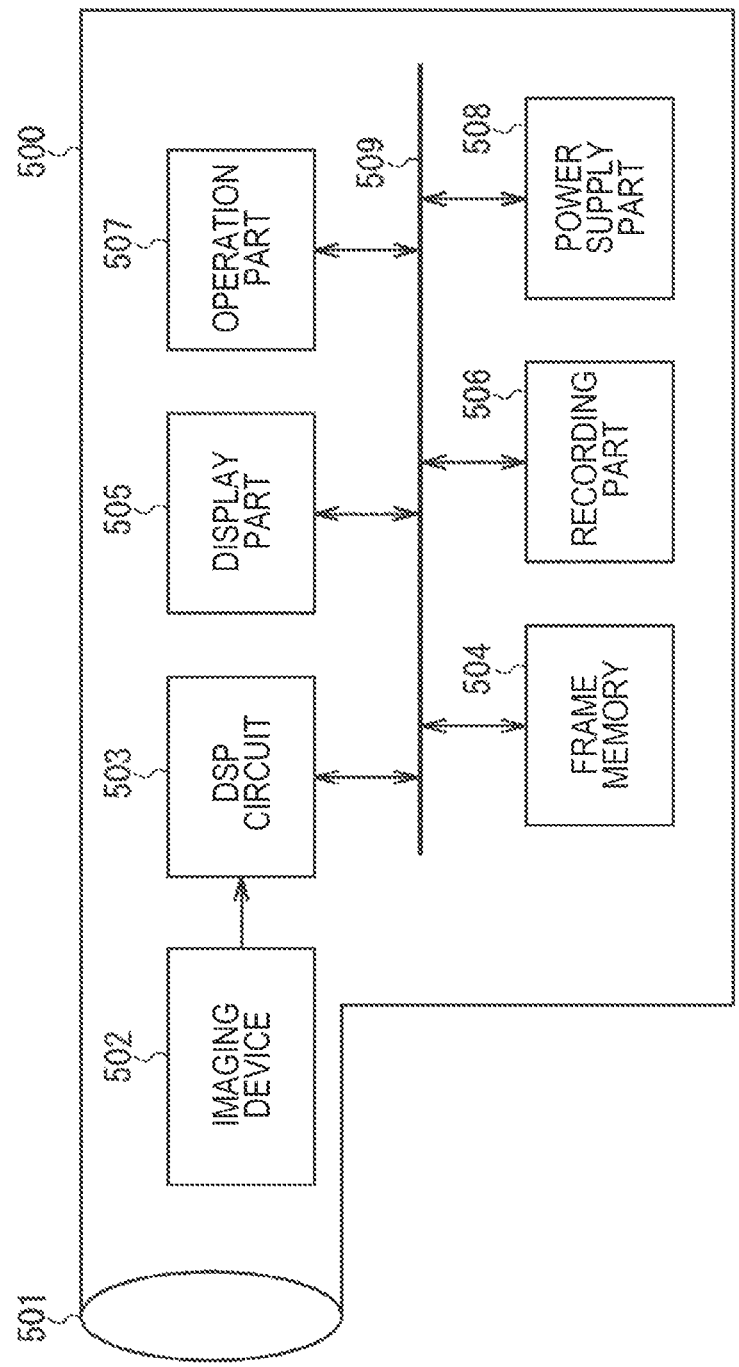
FIG. 16 is a block diagram illustrating an exemplary configuration of an electronic device.

FIG. 16 is a diagram illustrating an exemplary configuration of an electronic device 500 to which the imaging device is applied.

The electronic device 500 is an electronic device including a shooting apparatus such as digital still camera or video camera, a portable terminal apparatus such as Smartphone or tablet terminal, or the like, for example.

In FIG. 16, the electronic device 500 includes a lens 501, an imaging device 502, a DSP circuit 503, a frame memory 504, a display part 505, a recording part 506, an operation part 507, and a power source part 508. Further, the DSP circuit 503, the frame memory 504, the display part 505, the recording part 506, the operation part 507, and the power source part 508 in the electronic device 500 are mutually connected via a bus line 509.

Then, the imaging device 10 of FIG. 1 is applicable as the imaging device 502.

The DSP circuit 503 is a signal processing circuit configured to process a signal supplied from the imaging device 502. The DSP circuit 503 outputs image data obtained by processing a signal from the imaging device 502. The frame memory 504 temporarily holds image data processed in the DSP circuit 503 in units of frame.

The display part 505 is configured of a panel-type display apparatus such as liquid crystal panel or organic electro luminescence (EL) panel, for example, and displays a moving picture or still image shot by the imaging device 502. The recording part 506 records image data of a moving picture or still image shot by the imaging device 502 in a recording medium such as semiconductor memory or hard disc.

The operation part 507 outputs operation instructions for various functions of the electronic device 500 in response to a user's operation. The power source part 508 supplies various power for operating the DSP circuit 503, the frame memory 504, the display part 505, the recording part 506, and the operation part 507 to the parts to be supplied as needed.

<6-3. Exemplary Application to Surgery System>

Figure 17:
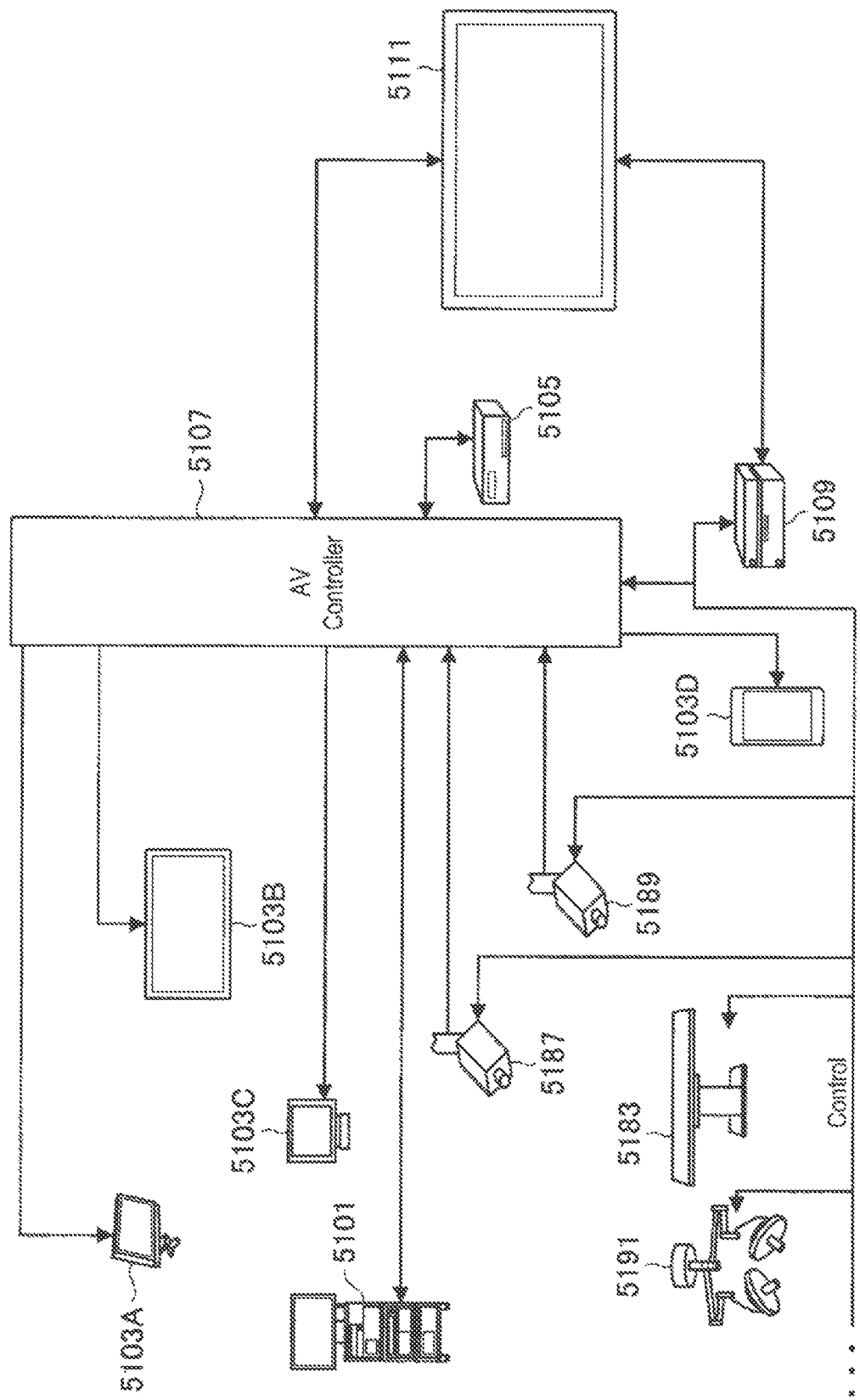
FIG. 17 is a diagram schematically illustrating an entire configuration of an operating room system.

FIG. 17 is a diagram schematically illustrating an entire configuration of an operating room system 5100 to which the technology according to the present disclosure is applicable. With reference to FIG. 17, the operating room system 5100 is configured such that a group of apparatuses installed in an operating room are connected to be able to be mutually associated via an audiovisual controller (AV controller) 5107 and an operating room control apparatus 5109.

Various apparatuses can be installed in the operating room. FIG. 17 illustrates, by way of example, a group of various apparatuses 5101 for endoscopic surgery, a ceiling camera 5187 provided on the ceiling of the operating room and configured to shoot the hands of an operator, an operation site camera 5189 provided on the ceiling of the operating room and configured to shoot the entire operating room, a plurality of display apparatuses 5103A to 5103D, a recorder 5105, a patient bed 5183, and a light 5191.

Here, the group of apparatuses 5101 among the apparatuses belong to an endoscopic surgery system 5113 described below, and is configured of an endoscope, a display apparatus configured to display an image shot by the endoscope, and the like. Each apparatus belonging to the endoscopic surgery system 5113 is also called medical device. On the other hand, the display apparatuses 5103A to 5103D, the recorder 5105, the patient bed 5183, and the light 5191 are provided in the operating room separate from the endoscopic surgery system 5113, for example. Each apparatus not belonging to the endoscopic surgery system 5113 is also called non-medical device. The audiovisual controller 5107 and/or the operating room control apparatus 5109 mutually associates and controls the operations of the medical devices and the non-medical devices.

The audiovisual controller 5107 totally controls the image display processings in the medical devices and the non-medical devices. Specifically, the group of apparatuses 5101, the ceiling camera 5187, and the operation site camera 5189 among the apparatuses provided in the operating room system 5100 can be apparatuses (denoted as source apparatuses below) having a function of originating information to be displayed during an operation (denoted as display information below). Further, the display apparatuses 5103A to 5103D can be apparatuses to which the display information is output (denoted as destination apparatuses below). Further, the recorder 5105 can be an apparatus corresponding to both a source apparatus and a destination apparatus. The audiovisual controller 5107 has the functions of controlling the operations of the source apparatuses and the destination apparatuses, obtaining display information from a source apparatus, transmitting the display information to a destination apparatus, and displaying or recording the display information. Additionally, the display information is various images shot during an operation, various items of information indicating an operation (such as patient's physical information, information associated with past medical check results or operative procedures, and the like), or the like.

Specifically, information indicating the images of an operation site in the body cavity of a patient shot by the endoscope can be transmitted as display information from the group of apparatuses 5101 to the audiovisual controller 5107. Further, information indicating the images of the hands of an operator shot by the ceiling camera 5187 can be transmitted as display information from the ceiling camera 5187. Further, information indicating the images of the entire operating room shot by the operation site camera 5189 can be transmitted as display information from the operation site camera 5189. Additionally, in a case where other apparatus having the shooting function is present in the operating room system 5100, the audiovisual controller 5107 may obtain information indicating the images shot by the other apparatus as display information also from the other apparatus.

Alternatively, the information indicating the images shot in the past is recorded in the recorder 5105 by the audiovisual controller 5107, for example. The audiovisual controller 5107 can obtain the information indicating the images shot in the past as display information from the recorder 5105. Additionally, various items of information associated with operations may be previously recorded in the recorder 5105.

The audiovisual controller 5107 causes at least any of the display apparatuses 5103A to 5103D as destination apparatuses to display the obtained displayed information (or the images shot during an operation or various items of information associated with an operation). In the illustrated example, the display apparatus 5103A is suspended from the ceiling of the operating room, the display apparatus 5103B is installed on a wall of the operating room, the display apparatus 5103C is installed on a desk in the operating room, and the display apparatus 5103D is a mobile device (such as tablet personal computer (PC)) having the display function.

Further, though not illustrated in FIG. 17, the operating room system 5100 may include apparatuses outside the operating room. The apparatuses outside the operating room may be, for example, servers connected to networks constructed inside and outside the hospital, PCs used by medical staff, a projector installed in a conference room in the hospital, and the like. In a case where such external apparatuses are present outside the hospital, the audiovisual controller 5107 can display the display information on a display apparatus in other hospital via a TV conference system or the like for remote medical care.

The operating room control apparatus 5109 totally controls the processings other than the image display processings in the non-medical devices. For example, the operating room control apparatus 5109 controls driving the patient bed 5183, the ceiling camera 5187, the operation site camera 5189, and the light 5191.

The operating room system 5100 is provided with a centralized operation panel 5111, and the user can issue an image display instruction to the audiovisual controller 5107 or issue an instruction to operate a non-medical device to the operating room control apparatus 5109 via the centralized operation panel 5111. The centralized operation panel 5111 is configured such that a touch panel is provided on the display face of the display apparatus.

Figure 18:
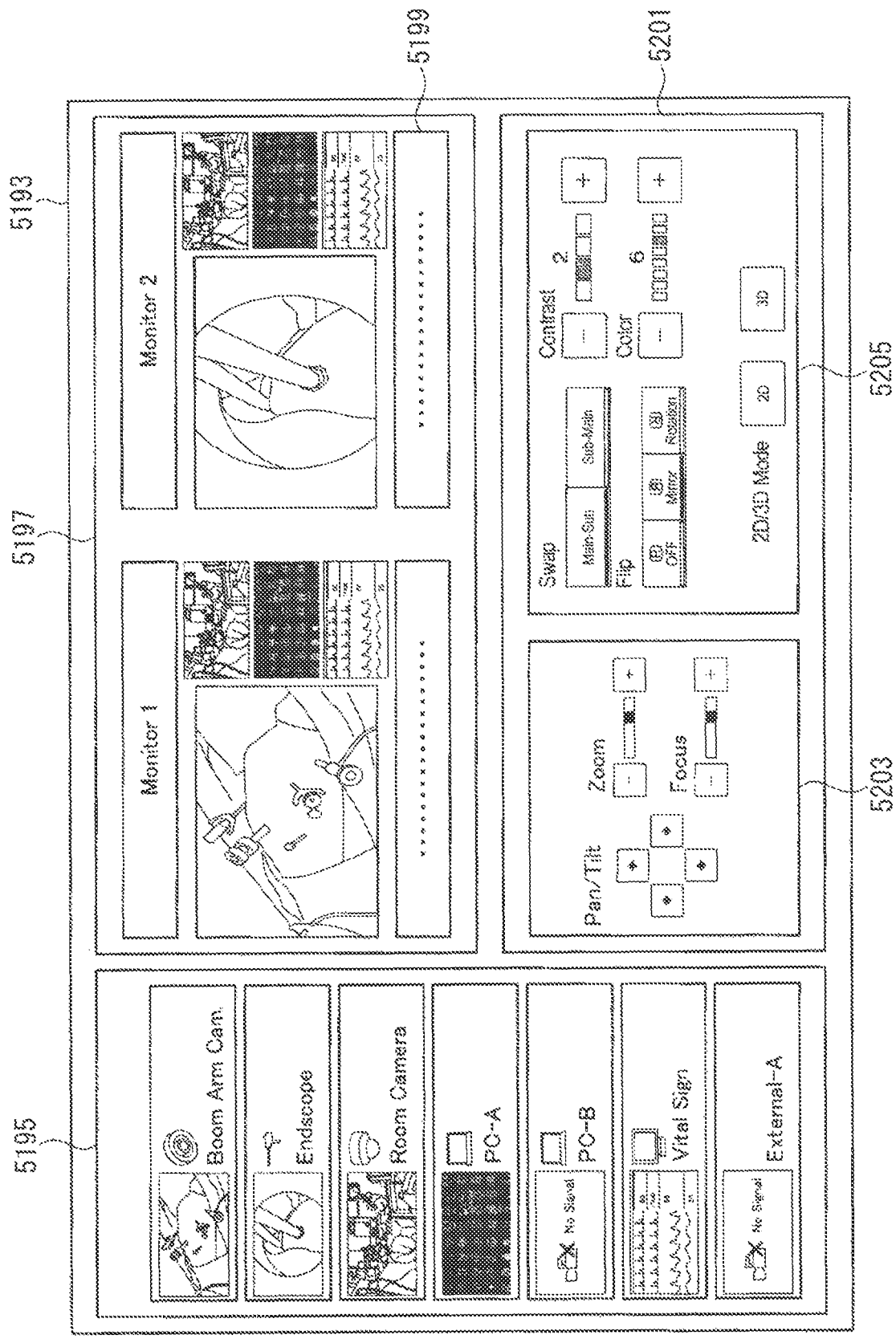
FIG. 18 is a diagram illustrating exemplary display of an operation screen in a centralized operation panel.

FIG. 18 is a diagram illustrating exemplary display of an operation screen in the centralized operation panel 5111. FIG. 18 illustrates, by way of example, an operation screen in a case where two display apparatuses are provided as destination apparatuses in the operating room system 5100. With reference to FIG. 18, an operation screen 5193 is provided with a source selection region 5195, a preview region 5197, and a control region 5201.

The source selection region 5195 displays the source apparatuses provided in the operating room system 5100 and the thumbnail screens indicating the display information of the source apparatuses to be associated with each other. The user can select display information to be displayed on the display apparatus from any source apparatus displayed in the source selection region 5195.

The preview region 5197 displays screen previews displayed on the two display apparatuses (Monitor1 and Monitor2) as destination apparatuses. In the illustrated example, four images are displayed in PinP on one display apparatus. The four images correspond to the display information originated from a source apparatus selected in the source selection region 5195. One of the four images is displayed as a main image to be relatively large, and the remaining three images are displayed as sub-images to be relatively small. The user selects the region in which the four images are displayed as needed thereby to rearrange the main image and the sub-images. Further, a status display region 5199 is provided at the lower part of the region where the four images are displayed, and a status (such as elapsed time of operation, patient's physical information, or the like) associated with an operation can be displayed in the region as needed.

The control region 5201 is provided with a source operation region 5203 in which graphical user interface (GUI) parts for operating a source apparatus are displayed and a destination operation region 5205 in which GUI parts for operating a destination apparatus are displayed. In the illustrated example, the source operation region 5203 is provided with GUI parts for performing various operations (pan, tilt, and zoom) on a camera in a source apparatus having the shooting function. The user selects the GUI parts as needed thereby to operate the camera in the source apparatus. Additionally, though not illustrated, in a case where the source apparatus selected in the source selection region 5195 is a recorder (that is, in a case where the images recorded in the recorder in the past are displayed in the preview region 5197), the source operation region 5203 can be provided with GUI parts for performing the operations such as reproduction, stop, rewind, and fast-forward of the images.

Further, the destination operation region 5205 is provided with GUI parts for performing various operations (swap, flip, color adjustment, contrast adjustment, and switching between 2D display and 3D display) on the display on the display apparatus as a destination apparatus. The user selects the GUI parts as needed thereby to operate the display on the display apparatus.

Additionally, an operation screen displayed on the centralized operation panel 5111 is not limited to the illustrated example, and the user may be able to input an operation in each apparatus controllable by the audiovisual controller 5107 and the operating room control apparatus 5109 provided in the operating room system 5100 via the centralized operation panel 5111.

Figure 19:
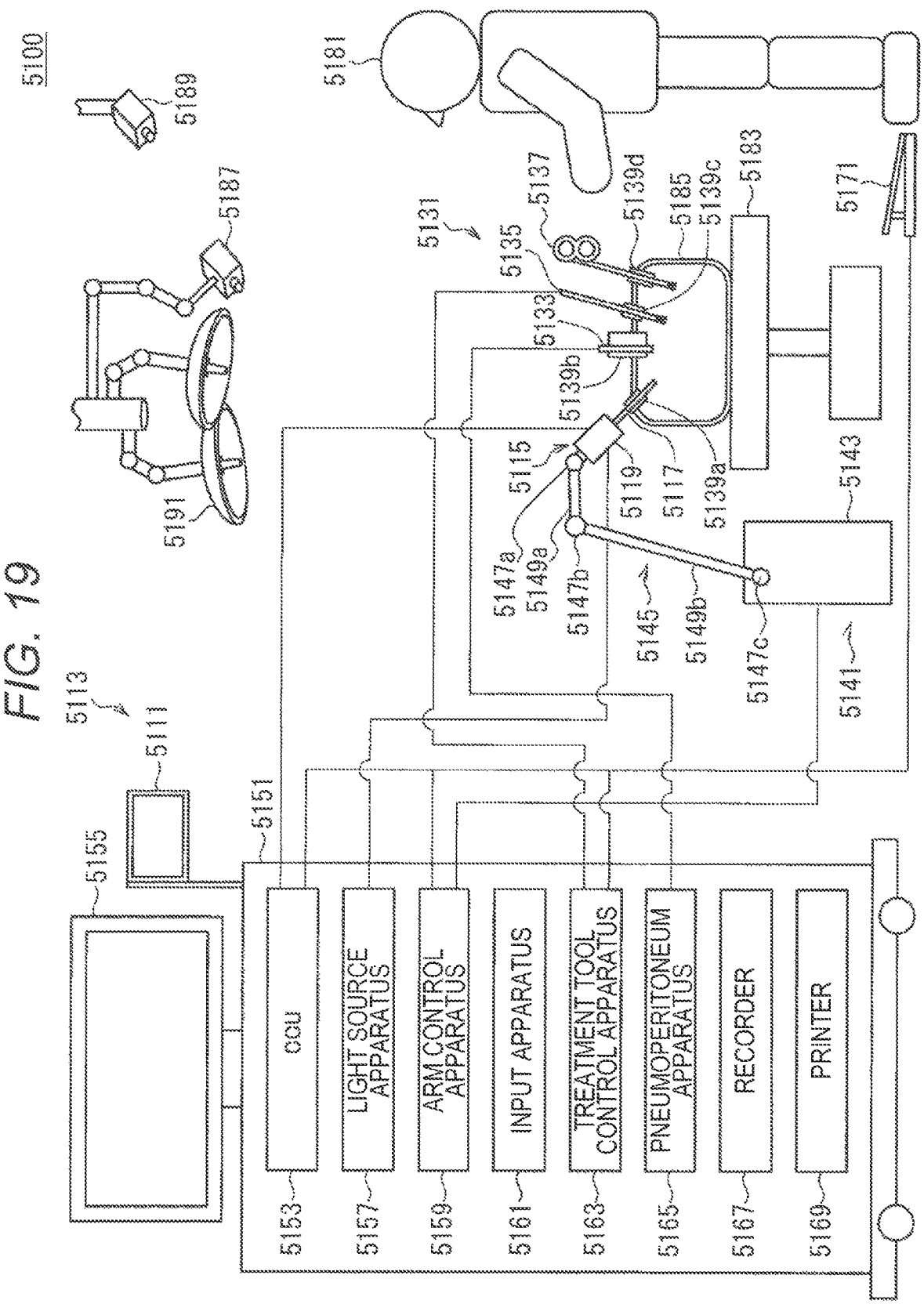
FIG. 19 is a diagram illustrating an exemplary situation of an operation according to the operating room system.

FIG. 19 is a diagram illustrating an operation to which the above-described operating room system is applied by way of example. The ceiling camera 5187 and the operation site camera 5189 are provided on the ceiling of the operating room, and can shoot the hands of an operator (doctor) 5181 who treats a diseased site of a patient 5185 on the patient bed 5183 and the entire operating room. The ceiling camera 5187 and the operation site camera 5189 can be provided with a magnification adjustment function, a focal distance adjustment function, a shooting direction adjustment function, and the like. The light 5191 is provided on the ceiling of the operating room, and irradiates at least the hands of the operator 5181. The light 5191 may be able to adjust the amount of irradiated light, a wavelength (color) of an irradiated light, an irradiation direction of a light, and the like as needed.

The endoscopic surgery system 5113, the patient bed 5183, the ceiling camera 5187, the operation site camera 5189, and the light 5191 are connected to be mutually associated via the audiovisual controller 5107 and the operating room control apparatus 5109 (not illustrated in FIG. 19) as illustrated in FIG. 17. The centralized operation panel 5111 is provided in the operating room, and the user can operate the apparatuses present in the operating room via the centralized operation panel 5111 as needed as described above.

A configuration of the endoscopic surgery system 5113 will be described below in detail. As illustrated, the endoscopic surgery system 5113 is configured of an endoscope 5115, other surgical instruments 5131, a support arm apparatus 5141 configured to support the endoscope 5115, and a cart 5151 on which various apparatuses for endoscopic surgery are mounted.

A plurality of tubular openers called trocars 5139a to 5139d are tapped into the abdominal wall in the endoscopic surgery instead of making an incision in the abdominal wall.

Then, a lens tube 5117 of the endoscope 5115 or other surgical instruments 5131 are inserted from the trocars 5139a to 5139d into the body cavity of the patient 5185. In the illustrated example, the surgical instruments 5131 including a pneumoperitoneum tube 5133, an energy treatment tool 5135, and forceps 5137 are inserted into the body cavity of the patient 5185. Further, the energy treatment tool 5135 is directed, for example, for making an incision in and releasing a tissue or sealing a blood vessel by use of high-frequency current or ultrasonic vibration. However, the illustrated surgical instruments 5131 are merely exemplary, and various surgical instruments generally used for endoscopic surgery such as tweezers and retractor may be used for the surgical instruments 5131, for example.

An image of an operation site in the body cavity of the patient 5185 shot by the endoscope 5115 is displayed on a display apparatus 5155. The operator 5181 makes a treatment such as removing a diseased site by use of the energy treatment tool 5135 or the forceps 5137 while watching the images of the operation site displayed on the display apparatus 5155 in real time. Additionally, though not illustrated, the pneumoperitoneum tube 5133, the energy treatment tool 5135, and the forceps 5137 are supported by the operator 5181, an assistant, or the like during an operation.

(Support Arm Apparatus)

The support arm apparatus 5141 includes an arm part 5145 extending from a base part 5143. In the illustrated example, the arm part 5145 is configured of joint parts 5147a, 5147b, and 5147c, and links 5149a and 5149b, and is driven under control of an arm control apparatus 5159. The endoscope 5115 is supported by the arm part 5145 and its position and posture are controlled. Thereby, the endoscope 5115 can be fixed at a stable position.

(Endoscope)

The endoscope 5115 is configured of the lens tube 5117 a region of which in a predetermined length from the tip is inserted into the body cavity of the patient 5185, and a camera head 5119 connected to the base of the lens tube 5117. In the illustrated example, the endoscope 5115 configured as a so-called rigid scope having the hard lens tube 5117 is illustrated, but the endoscope 5115 may be configured as a so-called flexible scope having the flexible lens tube 5117.

An opening fit with an objective lens is provided on the tip of the lens tube 5117. The endoscope 5115 is connected with a light source apparatus 5157, and a light generated by the light source apparatus 5157 is guided to the tip of the lens tube by a light guide extending into the lens tube 5117 and is irradiated toward an object to be observed in the body cavity of the patient 5185 via the objective lens. Additionally, the endoscope 5115 may be a forward-viewing endoscope, or may be an oblique-viewing endoscope or a side-viewing endoscope.

An optical system and an imaging device are provided inside the camera head 5119, and a reflected light (observation light) from an object to be observed is condensed on the imaging device by the optical system. The observation light is photoelectrically converted by the imaging device thereby to generate an electric signal corresponding to the observation light, or an image signal corresponding to the observed image. The image signal is transmitted as RAW data to a camera control unit (CCU) 5153. Additionally, the functions of driving the optical system as needed and adjusting a magnification and a foal distance are mounted on the camera head 5119.

Additionally, a plurality of imaging devices may be provided in the camera head 5119 for stereoscopic view (3D display) or the like, for example. In this case, a plurality of relay optical systems configured to guide an observation light to each of the plurality of imaging devices are provided in the lens tube 5117.

(Various Apparatuses Mounted on Cart)

The CCU 5153 is configured of a central processing unit (CPU), a graphics processing unit (GPU), or the like, and totally controls the operations of the endoscope 5115 and the display apparatus 5155. Specifically, the CCU 5153 performs various image processings for displaying an image based on an image signal, such as development processing (demosaic processing), for example, on the image signal received from the camera head 5119. The CCU 5153 provides the display apparatus 5155 with the image-processed image signal. Further, the CCU 5153 is connected with the audiovisual controller 5107 illustrated in FIG. 17. The CCU 5153 provides the image-processed image signal also to the audiovisual controller 5107. Further, the CCU 5153 transmits a control signal to the camera head 5119, and controls driving the same. The control signal can include information associated with the shooting conditions such as magnification and focal distance. The information associated with the shooting conditions may be input via an input apparatus 5161, or may be input via the above-described centralized operation panel 5111.

The display apparatus 5155 displays an image based on an image signal image-processed by the CCU 5153 under control of the CCU 5153. In a case where the endoscope 5115 is for high-resolution shooting such as 4K (3840 horizontal pixels×2160 vertical pixels), 8K (7680 horizontal pixels×4320 vertical pixels), or the like, and/or for 3D display, the display apparatus 5155 capable of high-resolution display and/or 3D display can be accordingly used. In a case where the endoscope 5115 is for high-resolution shooting such as 4K or 8K, the display apparatus 5155 with a size of 55 inches or more is used so that an enhanced sense of immersion is obtained. Further, a plurality of display apparatuses 5155 with different resolutions and sizes may be provided depending on the intended use.

The light source apparatus 5157 is configured of a light source such as light emitting diode (LED), for example, and supplies the endoscope 5115 with an irradiation light when shooting an operation site.

The arm control apparatus 5159 is configured of a processor such as CPU, for example, and operates according to a predetermined program thereby to control driving of the arm part 5145 in the support arm apparatus 5141 according to a predetermined control system.

The input apparatus 5161 is an input interface for the endoscopic surgery system 5113. The user can input various items of information or instructions into the endoscopic surgery system. 5113 via the input apparatus 5161. For example, the user inputs various items of information associated with an operation such as patient's physical information or operative procedure information via the input apparatus 5161. Further, for example, the user inputs an instruction to drive the arm part 5145, an instruction to change the shooting conditions (kind of irradiation light, magnification, focal distance, and the like) by the endoscope 5115, an instruction to drive the energy treatment tool 5135, and the like via the input apparatus 5161.

The kinds of the input apparatus 5161 are not limited and the input apparatus 5161 may be various well-known input apparatuses. For example, a mouse, a keyboard, a touch panel, switches, a foot switch 5171, and/or a lever are applicable for the input apparatus 5161. In a case where the input apparatus 5161 uses a touch panel, the touch panel may be provided on the display face of the display apparatus 5155.

Alternatively, the input apparatus 5161 is a user-worn device such as glass-type wearable device or head mounted display (HMD), for example, and receives various inputs depending on user's gesture or line of sight detected by the device. Further, the input apparatus 5161 includes a camera capable of detecting user's motions, and receives various inputs depending on user's gesture or line of sight detected from a video shot by the camera. Furthermore, the input apparatus 5161 includes a microphone capable of collecting user's voice, and receives various inputs by speech via the microphone. The input apparatus 5161 is configured to be able to input various items of information in a non-contact manner in this way so that especially the user (such as the operator 5181) in a clean area can operate a device in a non-clean area in a non-contact manner. Further, the user can operate the device without releasing his/her hold on a surgical instrument, thereby improving user's convenience.

A treatment tool control apparatus 5163 controls driving the energy treatment tool 5135 for cauterizing and making an incision in a tissue, sealing a blood vessel, or the like. A pneumoperitoneum apparatus 5165 feeds gas into a body cavity via the pneumoperitoneum tube 5133 to expand the body cavity of the patient 5185 in order to secure a field of view of the endoscope 5115 and to secure a working space of the operator. A recorder 5167 is an apparatus capable of recording various items of information associated with an operation. A printer 5169 is an apparatus capable of printing various items of information associated with an operation in various formats such as text, image, and graph.

Particularly characteristic components in the endoscopic surgery system 5113 will be described below in more detail.

(Support Arm Apparatus)

The support arm apparatus 5141 includes the base part 5143 as a base table, and the arm part 5145 extending from the base part 5143. In the illustrated example, the arm part 5145 is configured of the plurality of joint parts 5147a, 5147b, and 5147c, and the links 5149a and 5149b coupled by the joint part 5147b, but a simplified configuration of the arm part 5145 is illustrated for brief illustration in FIG. 19. Actually the shapes, the numbers, and the arrangements of the joint parts 5147a to 5147c and the links 5149a and 5149b, and the rotation axis directions and the like of the joint parts 5147a to 5147c can be set as needed such that the arm part 5145 has a desired degree of freedom. For example, the arm part 5145 can be suitably configured to have six or more degrees of freedom. Thereby, the endoscope 5115 can be freely moved in the movable range of the arm part 5145, and thus the lens tube 5117 of the endoscope 5115 can be inserted into the body cavity of the patient 5185 in a desired direction.

Each of the joint parts 5147a to 5147c is provided with an actuator, and each of the joint parts 5147a to 5147c is driven by the actuator to be rotatable about a predetermined rotation axis. The arm control apparatus 5159 controls driving the actuators so that the rotation angle of each of the joint parts 5147a to 5147c is controlled and the arm part 5145 is controlled to be driven. Thereby, the position and the posture of the endoscope 5115 can be controlled. At this time, the arm control apparatus 5159 can control driving of the arm part 5145 in various well-known control systems such as force control and position control.

For example, the operator 5181 inputs an operation via the input apparatus 5161 (including the foot switch 5171) as needed so that the arm control apparatus 5159 may control driving of the arm part 5145 in response to the input operation as needed and the position and the posture of the endoscope 5115 may be controlled. Under the control, the endoscope 5115 at the tip of the arm part 5145 is moved from a position to another position, and then can be fixedly supported at the position after the movement. Additionally, the arm part 5145 may be operated in a so-called master-slave system. In this case, the arm part 5145 can be remotely operated by the user via the input apparatus 5161 installed away from the operating room.

Further, in a case where force control is applied, the arm control apparatus 5159 may perform so-called power assist control for driving the actuators of the respective joint parts 5147a to 5147c such that the arm part 5145 can smoothly move according to an external force received from the user. Thereby, when moving the arm part 5145 while directly contacting the arm part 5145, the user can move the arm part 5145 with a relatively weak force. Therefore, the endoscope 5115 can be more intuitively moved in a simpler operation, thereby improving user's convenience.

Here, the endoscope 5115 is generally supported by a doctor called scopist in endoscopic surgery. To the contrary, the position of the endoscope 5115 can be more accurately fixed not manually but by use of the support arm apparatus 5141, thereby stably obtaining images of an operation site and smoothly performing an operation.

Additionally, the arm control apparatus 5159 does not necessarily need to be provided on the cart 5151. Further, one arm control apparatus 5159 is not necessarily provided. For example, the arm control apparatuses 5159 may be provided for the joint parts 5147a to 5147c in the arm part 5145 in the support arm apparatus 5141, respectively, and the plurality of arm control apparatuses 5159 mutually cooperate thereby to control driving of the arm part 5145.

(Light Source Apparatus)

The light source apparatus 5157 supplies the endoscope 5115 with an irradiation light for shooting an operation site. The light source apparatus 5157 is configured of a LED, a laser light source, or a white light source configured in combination of them, for example. At this time, in a case where the white light source is configured in combination of RGB laser light sources, an output intensity and an output timing of each color (each wavelength) can be controlled with high accuracy, and thus white balance of a shot image can be adjusted in the light source apparatus 5157. Further, in this case, a laser light is irradiated from each of the RGB laser light sources on an object to be observed in a time division manner and the imaging device of the camera head 5119 is controlled to be driven in synchronization with the irradiation timings, thereby shooting the images corresponding to RGB in a time division manner. With the method, a color image can be obtained without a color filter in the imaging device.

Further, the light source apparatus 5157 may be controlled to be driven such that the intensity of a light to be output is changed per predetermined time. The imaging device in the camera head 5119 is controlled to be driven in synchronization with the timing to change the intensity of the light thereby to obtain images in a time division manner, and the images are combined thereby to generate an image with a high dynamic range without blocked-up shadows and blown-out highlights.

Further, the light source apparatus 5157 may be configured to be able to supply a light in a predetermined wavelength band corresponding to special band imaging. With the special band imaging, for example, a light in a narrower band than an irradiation light (or white light) during normal observation is irradiated by use of the wavelength dependency of absorption of the light into a body tissue so that so-called narrow band imaging for shooting a predetermined tissue such as blood vessel in a superficial portion of the mucous membrane with high contrast is performed. Alternatively, with the special band imaging, there may be performed fluorescent imaging for obtaining an image by fluorescence caused by irradiating an excitation light. With the fluorescent imaging, an excitation light is irradiated on a body tissue to observe florescence from the body tissue (autofluorescent imaging), or a regent such as indocyanine green (ICG) is locally injected in a body tissue and an excitation light corresponding to the fluorescent wavelength of the reagent is irradiated on the body tissue thereby to obtain a fluorescent image, for example. The light source apparatus 5157 can be configured to be able to supply a narrow-band light and/or an excitation light corresponding to such special band imaging.

(Camera Head and CCU)

Figure 20:
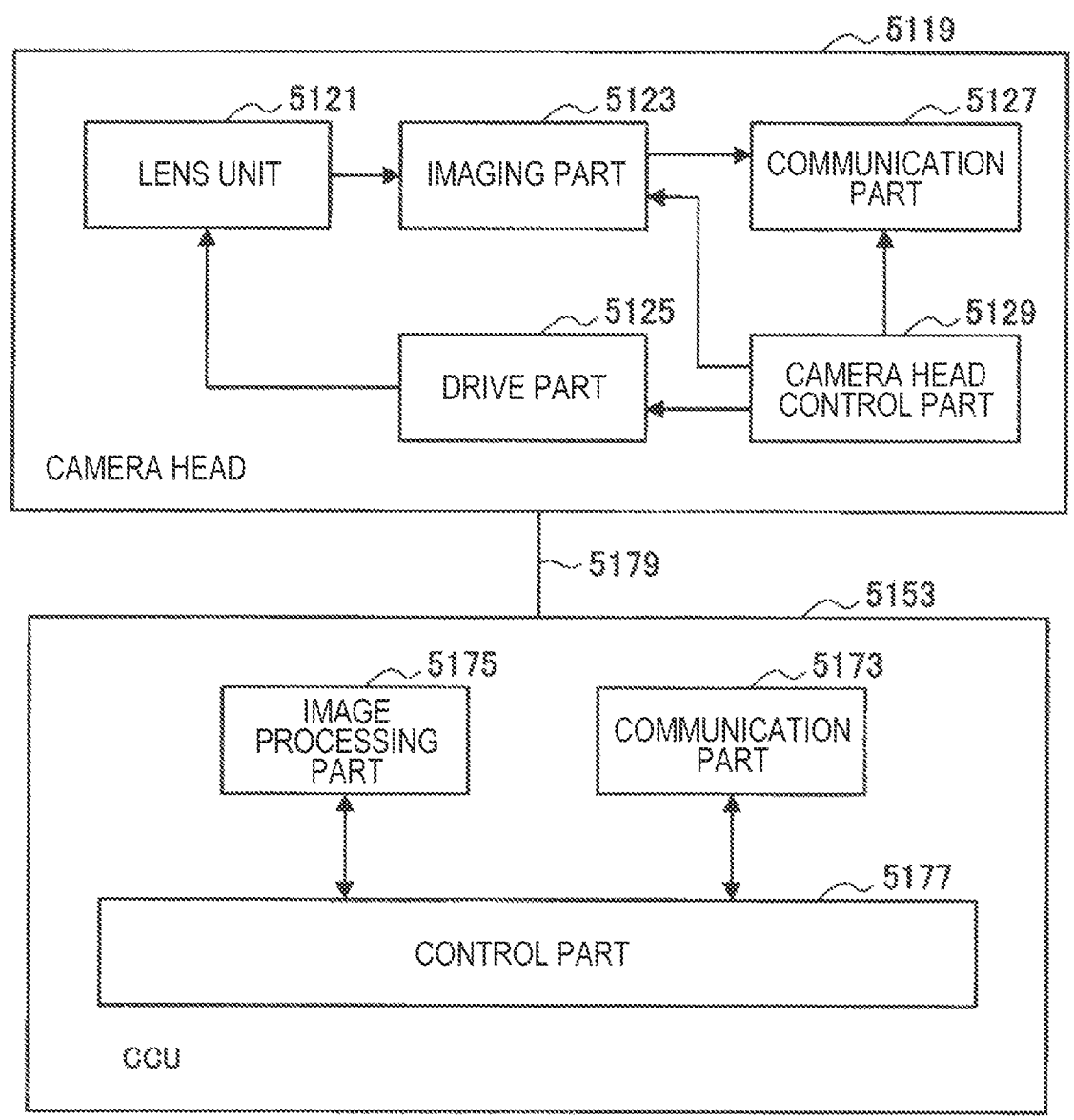
FIG. 20 is a block diagram illustrating exemplary functional configurations of a camera head and a CCU illustrated in FIG. 19.

The functions of the camera head 5119 and the CCU 5153 in the endoscope 5115 will be described in more detail with reference to FIG. 20. FIG. 20 is a block diagram illustrating the exemplary functional configurations of the camera head 5119 and the CCU 5153 illustrated in FIG. 19.

With reference to FIG. 20, the camera head 5119 has the functions of a lens unit 5121, an imaging part 5123, a drive part 5125, a communication part 5127, and a camera head control part 5129. Further, the CCU 5153 has the functions of a communication part 5173, an image processing part 5175, and a control part 5177. The camera head 5119 and the CCU 5153 are connected via a transmission cable 5179 to be bi-directionally communicable.

The functional configuration of the camera head 5119 will be first described. The lens unit 5121 is an optical system provided at the part connected to the lens tube 5117. An observation light taken in from the tip of the lens tube 5117 is guided to the camera head 5119 and is incident in the lens unit 5121. The lens unit 5121 is configured in a combination of a plurality of lenses including a zoom lens and a focus lens. The lens unit 5121 is adjusted in its optical property to condense an observation light on the light receiving face of an imaging device in the imaging part 5123. Further, the zoom lens and the focus lens are configured to be movable in their positions on an optical axis in order to adjust a magnification and a focal point of a shot image.

The imaging part 5123 is configured of an imaging device, and is arranged behind the lens unit 5121. An observation light passing through the lens unit 5121 is condensed on the light receiving face of the imaging device and an image signal corresponding to the observed image is generated by photoelectric conversion. The image signal generated by the imaging part 5123 is provided to the communication part 5127.

The imaging device configuring the imaging part 5123 is a complementary metal oxide semiconductor (CMOS) image sensor, for example, and uses an image sensor having the Bayer layout and capable of color shooting. Additionally, the imaging device may employ an image sensor capable of shooting an image with a high resolution of 4K or more, for example. A high-resolution image of an operation site is obtained so that the operator 5181 can grasp the operation site in more detail and can more smoothly perform the operation.

Further, the imaging device configuring the imaging part 5123 is configured as one pair of imaging devices configured to obtain a right-eye image signal and a left-eye image signal for 3D display. With 3D display, the operator 5181 can more accurately grasp the depth of a body tissue in an operation site. Additionally, in a case where the imaging part 5123 is configured in a multiplate manner, a plurality of lens units 5121 are provided for the imaging devices, respectively.

Further, the imaging part 5123 may not necessarily be provided in the camera head 5119. For example, the imaging part 5123 may be provided inside the lens tube 5117 or immediately behind the objective lens.

The drive part 5125 is configured of an actuator, and is controlled by the camera head control part 5129 to move the zoom lens and the focus lens in the lens unit 5121 by a predetermined distance along the optical axis. Thereby, the magnification and the focal point of an image shot by the imaging part 5123 can be adjusted as needed.

The communication part 5127 is configured of a communication apparatus configured to exchange various items of information with the CCU 5153. The communication part 5127 transmits an image signal obtained from the imaging part 5123 as RAW data to the CCU 5153 via the transmission cable 5179. At this time, the image signal is preferably transmitted in optical communication in order to display the shot image of the operation site with low latency. This is because the operator 5181 performs an operation while observing a state of a diseased site by a shot image during the operation and thus a moving picture of the operation site needs to be displayed in real time if possible for safer and more accurate operation. In a case where optical communication is made, the communication part 5127 is provided with a photoelectric conversion module configured to convert an electric signal into an optical signal. An image signal is converted into an optical signal by the photoelectric conversion module, and is then transmitted to the CCU 5153 via the transmission cable 5179.

Further, the communication part 5127 receives a control signal for controlling driving the camera head 5119 from the CCU 5153. The control signal includes the information associated with the shooting conditions such as information to designate a frame rate of a shot image, information to designate an exposure value on shooting, and/or information to designate a magnification and a focal point of a shot image, or the like. The communication part 5127 provides the received control signal to the camera head control part 5129. Additionally, the control signal from the CCU 5153 may be also transmitted in optical communication. In this case, the communication part 5127 is provided with a photoelectric conversion module configured to convert an optical signal into an electric signal, and a control signal is converted into an electric signal by the photoelectric conversion module, and is then provided to the camera head control part 5129.

Additionally, the shooting conditions such as frame rate, exposure value, magnification, and focal point are automatically set by the control part 5177 in the CCU 5153 on the basis of an obtained image signal. That is, the so-called auto exposure (AE) function, the auto focus (AF) function, and the auto white balance (AWB) function are mounted on the endoscope 5115.

The camera head control part 5129 controls driving of the camera head 5119 on the basis of a control signal received from the CCU 5153 via the communication part 5127. For example, the camera head control part 5129 controls driving of the imaging device in the imaging part 5123 on the basis of the information to designate a frame rate of a shot image and/or the information to designate exposure on shooting. Further, for example, the camera head control part 5129 moves the zoom lens and the focus lens in the lens unit 5121 via the drive part 5125 as needed on the basis of the information to designate a magnification and a focal point of a shot image. The camera head control part 5129 may further include a function of storing information for identifying the lens tube 5117 or the camera head 5119.

Additionally, the components such as the lens unit 5121 and the imaging part 5123 are arranged in a sealed structure with high airtightness and water proof so that the camera head 5119 is resistant to the autoclave sterilization processing.

The functional configuration of the CCU 5153 will be described below. The communication part 5173 is configured of a communication apparatus configured to exchange various items of information with the camera head 5119. The communication part 5173 receives an image signal transmitted from the camera head 5119 via the transmission cable 5179. At this time, the image signal can be suitably transmitted in optical communication as described above. In this case, the communication part 5173 is provided with a photoelectric conversion module configured to convert an optical signal into an electric signal for the optical communication. The communication part 5173 provides an electric signal converted from an image signal to the image processing part 5175.

Further, the communication part 5173 transmits a control signal for controlling driving of the camera head 5119 to the camera head 5119. The control signal may be also transmitted in optical communication.

The image processing part 5175 performs various image processings on an image signal as RAW data transmitted from the camera head 5119. The image processings include various well-known signal processings such as development processing, image quality enhancement processings (for example, band emphasis processing, super-resolution processing, noise reduction (NR) processing, and/or blurring correction processing), and/or enlargement processing (electronic zoom processing), for example. Further, the image processing part 5175 performs a detection processing on an image signal for AE, AF and AWB.

The image processing part 5175 is configured of a processor such as CPU or GPU, and the processor operates according to predetermined programs so that the above image processings or the detection processing can be performed. Additionally, in a case where the image processing part 5175 is configured of a plurality of GPUs, the image processing part 5175 divides information associated with an image signal as needed, and performs the image processings by the plurality of GPUs in parallel.

The control part 5177 performs various controls for shooting an operation site by the endoscope 5115 and for displaying its shot image. For example, the control part 5177 generates a control signal for controlling driving of the camera head 5119. At this time, in a case where the shooting conditions are input by the user, the control part 5177 generates a control signal on the basis of the input by the user. Alternatively, in a case where the AE function, the AF function, and the AWB function are mounted on the endoscope 5115, the control part 5177 calculates an optimum exposure value, focal distance, and white balance as needed depending on a result of the detection processing by the image processing part 5175 thereby to generate a control signal.

Further, the control part 5177 causes the display apparatus 5155 to display an image of an operation site on the basis of an image signal image-processed by the image processing part 5175. At this time, the control part 5177 recognizes various objects in the image of the operation site by use of various image recognition technologies. For example, the control part 5177 can recognize a surgical instrument such as forceps, a specific living body site, bleeding, mist when the energy treatment tool 5135 is used, and the like by detecting shapes, colors, and the like of edges of objects included in the image of the operation site. When causing the display apparatus 5155 to display an image of an operation site, the control part 5177 causes it to display various items of operation assistant information to be overlapped on the image of the operation site by use of the recognition result. The operation assistant information is overlapped and displayed to be presented to the operator 5181 so that the operation can be more safely and more accurately performed.

The transmission cable 5179 connecting the camera head 5119 and the CCU 5153 is an electric signal cable for electric signal communication, an optical fiber for optical communication, or a composite cable of them.

Here, wired communication is made by use of the transmission cable 5179 in the illustrated example, but wireless communication may be made between the camera head 5119 and the CCU 5153. In a case where wireless communication is made therebetween, the transmission cable 5179 does not need to be provided in the operating room, and a situation in which the medical staff in the operating room is hindered from moving by the transmission cable 5179 can be eliminated.

The operating room system 5100 to which the technology according to the present disclosure is applicable has been described above by way of example. Additionally, here, the description has been made assuming that a medical system to which the operating room system 5100 is applied is the endoscopic surgery system 5113 by way of example, but a configuration of the operating room system 5100 is not limited to the example. For example, the operating room system 5100 may be applied to a flexible endoscope system for examination or a microscopic surgery system instead of the endoscopic surgery system 5113.

For example, the technology according to the present disclosure is suitably applicable to the ceiling camera 5187, the operation site camera 5189, and the imaging part 5123 in the endoscope 5115 among the above-described components. More specifically, for example, the technology according to the present disclosure is suitably applicable to the ceiling camera 5187, the operation site camera 5189, and the imaging device in the imaging part 5123 in the endoscope 5115. The technology according to the present disclosure is applied so that a high-quality image in which an occurrence of a sunspot phenomenon is restricted can be obtained, thereby improving diagnosis accuracy in remote medical care or more smoothly performing an operation, for example.

<6-4. Application to Mobile Object>

Further, for example, the technology according to the present disclosure may be realized as an apparatus mounted on any type of mobile object such as automobile, electric vehicle, hybrid electric vehicle, motorcycle, bicycle, personal mobility, airplane, drone, ship, robot, constructing machine, or agricultural machine (tractor).

Figure 21:
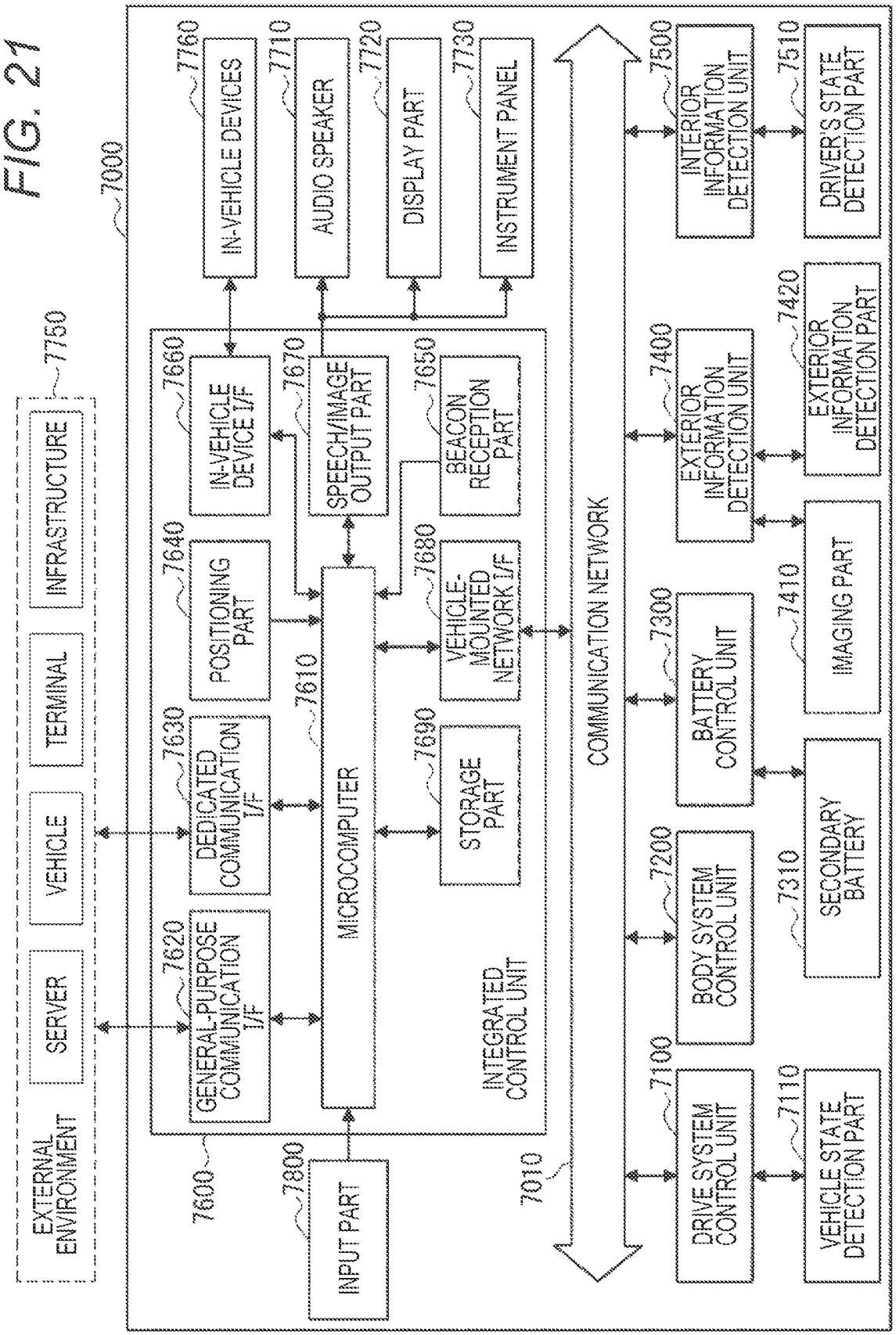
FIG. 21 is a block diagram illustrating an exemplary schematic configuration of a vehicle control system.

FIG. 21 is a block diagram illustrating an exemplary schematic configuration of a vehicle control system 7000 as an exemplary mobile object control system to which the technology according to the present disclosure is applicable. The vehicle control system 7000 includes a plurality of electronic control units connected via a communication network 7010. In the example illustrated in FIG. 21, the vehicle control system 7000 includes a drive system control unit 7100, a body system control unit 7200, a battery control unit 7300, an exterior information detection unit 7400, an interior information detection unit 7500, and an integrated control unit 7600. The communication network 7010 connecting the plurality of control units may be a vehicle-mounted communication network conforming to any standard such as controller area network (CAN), local interconnect network (LIN), local area network (LAN), FlexRay (registered trademark), or the like.

Each control unit includes a microcomputer configured to perform computation processings according to various programs, a storage part configured to store programs executed by the microcomputer or parameters or the like used for various computations, and a drive circuit configured to drive various apparatuses to be controlled. Each control unit comp includes rises a network I/F configured to make communication with the other control units via the communication network 7010, and includes a communication I/F configured to make wired communication or wireless communication with an apparatus, a sensor, or the like outside/inside the vehicle. FIG. 21 illustrates the functional components of the integrated control unit 7600 including a microcomputer 7610, a general-purpose communication I/F 7620, a dedicated communication I/F 7630, a positioning part 7640, a beacon reception part 7650, an in-vehicle device I/F 7660, a speech/image output part 7670, a vehicle-mounted network I/F 7680, and a storage part 7690. Each of the other control units similarly includes the microcomputer, the communication I/F, the storage part, and the like.

The drive system control unit 7100 controls the operations of the apparatuses associated with the vehicle drive system according to various programs. For example, the drive system control unit 7100 functions as a control apparatus for a driving force generation apparatus configured to generate a driving force of the vehicle such as internal engine or drive motor, a driving force transmission mechanism configured to transmit a driving force to the wheels, a steering mechanism configured to adjust a steering angle of the vehicle, a brake apparatus configured to generate a braking force of the vehicle, and the like. The drive system control unit 7100 may have the functions as a control apparatus such as antilock brake system (ABS) or electronic stability control (ESC).

The drive system control unit 7100 is connected with a vehicle state detection part 7110. The vehicle state detection part 7110 includes at least one of a gyro sensor configured to detect an angular speed of an axial rotation movement of the vehicle body, an acceleration sensor configured to detect an acceleration of the vehicle, or a sensor configured to detect the operation amount of the acceleration pedal, the operation amount of the brake pedal, a steering angle of the steering wheel, engine revolutions, a rotation speed of the wheels, and the like, for example. The drive system control unit 7100 performs the computation processings by use of signals input from the vehicle state detection part 7110 thereby to control the internal engine, the drive motor, the electric power steering apparatus, the brake apparatus, or the like.

The body system control unit 7200 controls the operations of various apparatuses mounted on the vehicle body according to various programs. For example, the body system control unit 7200 functions as a control apparatus for the keyless entry system, the smart key system, the power window apparatus, or various lights such as head lights, back lights, brake lights, indicators, and fog light. In this case, radio waves originated from a portable machine as a key or signals from various switches can be input into the body system control unit 7200. The body system control unit 7200 receives the input radio waves or signals, and controls the door lock apparatus, the power window apparatus, the lights, and the like of the vehicle.

The battery control unit 7300 controls a secondary battery 7310 as a power supply source of the drive motor according to various programs. For example, information indicating a battery temperature, a battery output voltage, a battery remaining capacity, and the like is input from a battery apparatus including the secondary battery 7310 into the battery control unit 7300. The battery control unit 7300 performs the computation processings by use of the signals, and controls temperature adjustment of the secondary battery 7310 or controls a cooling apparatus and the like provided in the battery apparatus.

The exterior information detection unit 7400 detects information outside the vehicle mounting the vehicle control system 7000 thereon. For example, the exterior information detection unit 7400 is connected with at least one of an imaging part 7410 or an exterior information detection part 7420. The imaging part 7410 includes at least one of a time of flight (ToF) camera, a stereo camera, a monocular camera, an infrared camera, and other camera. The exterior information detection part 7420 includes, for example, at least one of an environment sensor configured to detect current weather or meteorological phenomenon or a surrounding information detection sensor configured to detect other vehicles, obstacles, pedestrians, and the like around the vehicle mounting the vehicle control system 7000 thereon.

The environment sensor may be at least one of a raindrop sensor configured to detect rainy weather, a fog sensor configured to detect fog, a sunlight sensor configured to detect a degree of sunlight, and a snow sensor configured to detect snow fall, for example. The surrounding information detection sensor may be at least one of an ultrasonic sensor, a radar apparatus, and alight detection and ranging or laser imaging detection and ranging (LIDAR) apparatus. The imaging part 7410 and the exterior information detection part 7420 may be provided as independent sensors or apparatuses, or may be provided as an apparatus in which a plurality of sensors or apparatuses are integrated.

Figure 22:
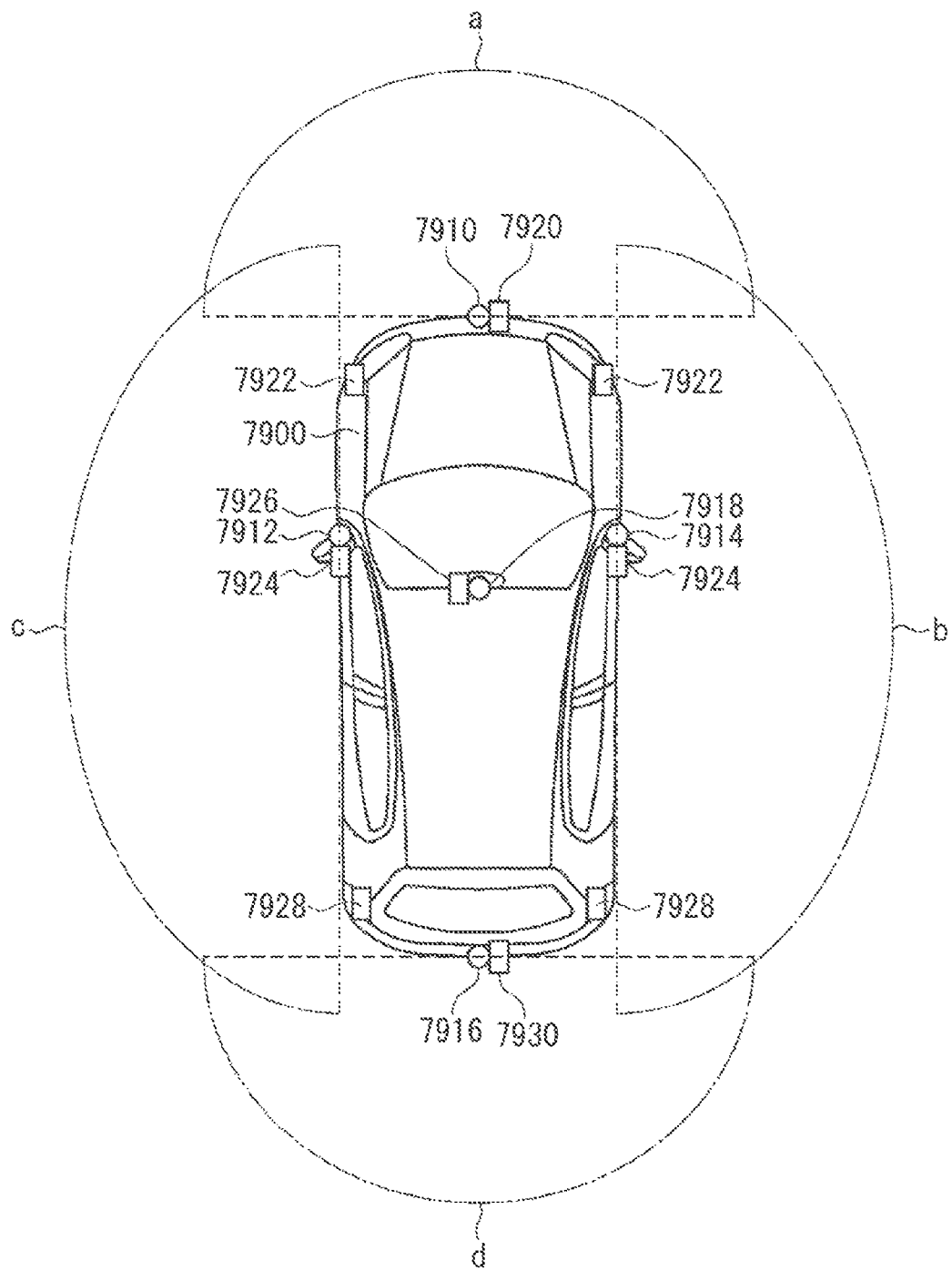
FIG. 22 is an explanatory diagram illustrating exemplary installation positions of an exterior information detection part and an imaging part.

Here, FIG. 22 illustrates exemplary installation positions of the imaging part 7410 and the exterior information detection part 7420. Imaging parts 7910, 7912, 7914, 7916, and 7918 are provided on at least one of the front nose, the side mirrors, the rear bumper or the back door, and the upper part of the windshield inside the vehicle of the vehicle 7900, for example. The imaging part 7910 provided on the front nose and the imaging part 7918 provided on the upper part of the windshield inside the vehicle mainly obtain images in front of a vehicle 7900. The imaging parts 7912 and 7914 provided on the side mirrors mainly obtain images on both sides of the vehicle 7900. The imaging part 7916 provided on the rear bumper or the back door mainly obtains images behind the vehicle 7900. The imaging part 7918 provided on the upper part of the windshield inside the vehicle is mainly used to detect a leading vehicle, a pedestrian, an obstacle, a traffic light, a traffic sign, a lane, and the like.

Additionally, FIG. 22 illustrates the shooting ranges of the imaging parts 7910, 7912, 7914, and 7916 by way of example. A shooting range a indicates a shooting range of the imaging part 7910 provided on the front nose, shooting ranges b and c indicate shooting ranges of the imaging parts 7914 and 7912 provided on the side mirrors, respectively, and a shooting range d indicates a shooting range of the imaging part 7916 provided on the rear bumper or the back door. For example, the image data shot by the imaging parts 7910, 7912, 7914, and 7916 is overlapped thereby to obtain a perspective image of the vehicle 7900 viewed from above.

Exterior information detection parts 7920, 7922, 7924, 7926, 7928, and 7930 provided on the front, the rear, the sides, the corners, and the upper part of the windshield inside the vehicle of the vehicle 7900 may be ultrasonic sensors or radar apparatuses, for example. The exterior information detection parts 7920, 7926, and 7930 provided on the front nose, the rear bumper or the back door, and the upper part of the windshield inside the vehicle of the vehicle 7900 may be LIDAR apparatuses, for example. The exterior information detection parts 7920 to 7930 are mainly used to detect a leading vehicle, a pedestrian, an obstacle, and the like.

Returning to FIG. 21, the description will be continued. The exterior information detection unit 7400 causes the imaging part 7410 to shoot an exterior image, and receives the shot image data. Further, the exterior information detection unit 7400 receives detection information from the connected exterior information detection part 7420. In a case where the exterior information detection part 7420 is an ultrasonic sensor, a radar apparatus, or a LIDAR apparatus, the exterior information detection unit 7400 originates an ultrasonic wave, an electromagnetic wave, or the like, and receives information indicating a received reflected light. The exterior information detection unit 7400 may perform a processing of detecting an object such as person, vehicle, obstacle, traffic sign, or characters on a road, or a distance detection processing on the basis of the received information. The exterior information detection unit 7400 may perform an environment recognition processing of recognizing rain fall, fog, road condition, and the like on the basis of the received information. The exterior information detection unit 7400 may calculate a distance to an object outside the vehicle on the basis of the received information.

Further, the exterior information detection unit 7400 may perform an image recognition processing of recognizing a person, a vehicle, an obstacle, a traffic sign, characters on a road, and the like, or a distance detection processing on the basis of the received image data. The exterior information detection unit 7400 may perform a distortion correction, positioning processing, or the like on the received image data, and may combine the different image data shot by the imaging part 7410 thereby to generate a perspective image or panorama image. The exterior information detection unit 7400 may perform a viewpoint conversion processing by use of the different image data shot by the imaging part 7410.

The interior information detection unit 7500 detects information inside the vehicle. The interior information detection unit 7500 is connected with a driver's state detection part 7510 configured to detect a driver's state, for example. The driver's state detection part 7510 may include a camera configured to shoot the driver, a biosensor configured to detect biological information of the driver, a microphone configured to collect speech inside the vehicle, or the like. The biosensor is, for example, provided on the seat, the steering wheel, or the like, and detects the biological information of a passenger seated on the seat or the driver gripping the steering wheel. The interior information detection unit 7500 may calculate a degree of fatigue or a degree of concentration of the driver, or determine whether the driver is sleeping on the basis of the detection information input from the driver's state detection part 7510. The interior information detection unit 7500 may perform a processing such as a noise cancel processing on a collected speech signal.

The integrated control unit 7600 controls the total operations in the vehicle control system 7000 according to various programs. The integrated control unit 7600 is connected with an input part 7800. The input part 7800 is realized by an apparatus capable of being operated for input by a passenger such as touch panel, buttons, microphone, switches, or lever, for example. Data obtained by recognizing the speech input via the microphone may be input into the integrated control unit 7600. The input part 7800 may be a remote control apparatus using an infrared ray or other radio wave, or an externally-connected device such as cell phone or personal digital assistant (PDA) for the operations of the vehicle control system 7000, for example. The input part 7800 may be a camera, for example, and in this case, a passenger can input information by his/her gesture. Alternatively, data obtained by detecting a motion of a passenger-worn wearable apparatus may be input. Further, the input part 7800 may include an input control circuit or the like configured to generate an input signal on the basis of the information input by a passenger or the like by use of the input part 7800 and to output the generated input signal to the integrated control unit 7600, for example. A passenger and the like operate the input part 7800 thereby to input various items of data or to instruct a processing operation to the vehicle control system 7000.

The storage part 7690 may include a read only memory (ROM) configured to store various programs executed by the microcomputer, and a random access memory (RAM) configured to store various parameters, computation results, sensor values, and the like. Further, the storage part 7690 may be realized by a magnetic storage device such as hard disc drive (HDD), a semiconductor storage device, an optical storage device, a magnetooptical storage device, or the like.

The general-purpose communication I/F 7620 is a general-purpose communication I/F configured to mediate communication with various devices present in an external environment 7750. The general-purpose communication I/F 7620 may mount a cellular communication protocol such as global system of mobile communications (GSM) (registered trademark), WiMAX, long term evolution (LTE), or LTE-advanced (LTE-A), or other wireless communication protocol such as wireless LAN (also denoted as Wi-Fi (registered trademark)) or Bluetooth (registered trademark). The general-purpose communication I/F 7620 may be connected to a device (such as application server or control server) present on an external network (such as Internet, Cloud network, or provider-specific network) via abase station or an access point, for example. Further, the general-purpose communication I/F 7620 may be connected to a terminal present near the vehicle (such as a terminal of a driver, a pedestrian, or a shop, or a machine type communication (MTC) terminal) by use of the peer to peer (P2P) technology, for example.

The dedicated communication I/F 7630 is a communication I/F configured to support a communication protocol defined for use in the vehicle. The dedicated communication I/F 7630 may mount a standard protocol such as wireless access in vehicle environment (WAVE) as a combination of the lower-layer IEEE802.11p and the higher-layer IEEE1609, dedicated short range communications (DSRC), or cellular communication protocol, for example. The dedicated communication I/F 7630 makes V2X communication as a concept typically including one or more of vehicle to vehicle communication, vehicle to infrastructure communication, vehicle to home communication, and vehicle to pedestrian communication.

The positioning part 7640 receives a global navigation satellite system (GNSS) signal from a GNSS satellite (such as global positioning system (GPS) signal from a GPS satellite), for example, to performing positioning, and generates position information including the latitude, longitude, and altitude of the vehicle. Additionally, the positioning part 7640 may specify a current position by exchanging signals with a wireless access point, and may obtain position information from a terminal such as cell phone, PHS, or Smartphone having the positioning function.

The beacon reception part 7650 receives a radio wave or an electromagnetic wave originated from a wireless station or the like installed on a road, for example, and obtains information indicating a current position, traffic jams, road closed, required time, and the like. Additionally, the function of the beacon reception part 7650 may be included in the above-described dedicated communication I/F 7630.

The in-vehicle device I/F 7660 is a communication interface configured to mediate connection between the microcomputer 7610 and various in-vehicle devices 7760 present inside the vehicle. The in-vehicle device I/F 7660 may establish wireless connection by use of a wireless communication protocol such as wireless LAN, Bluetooth (registered trademark), near field communication (NFC), or wireless USB (WUSB). Further, the in-vehicle device I/F 7660 may establish wired connection of universal serial bus (USB), high-definition multimedia interface (HDMI) (registered trademark), mobile high-definition link (MHL), or the like via a connection terminal (not illustrated) (and a cable as needed). The in-vehicle devices 7760 may include at least one of a mobile device or wearable device of a passenger, or an information device mounted on or attached to the vehicle, for example. Further, the in-vehicle devices 7760 may include a navigation apparatus configured to search a route to any destination. The in-vehicle device I/F 7660 exchanges control signals or data signals with the in-vehicle devices 7760.

The vehicle-mounted network I/F 7680 is an interface configured to mediate communication between the microcomputer 7610 and the communication network 7010. The vehicle-mounted network I/F 7680 exchanges signals and the like according to a predetermined protocol supported by the communication network 7010.

The microcomputer 7610 in the integrated control unit 7600 controls the vehicle control system 7000 according to various programs on the basis of the information obtained via at least one of the general-purpose communication I/F 7620, the dedicated communication I/F 7630, the positioning part 7640, the beacon reception part 7650, the in-vehicle device I/F 7660 and the vehicle-mounted network I/F 7680. For example, the microcomputer 7610 may compute a control target value of the driving force generation apparatus, the steering mechanism, or the brake apparatus on the basis of the obtained exterior and interior information, and outputs a control instruction to the drive system control unit 7100. For example, the microcomputer 7610 may perform cooperative control for realizing an advanced driver assistance system (ADAS) function including collision avoidance or collision alleviation of the vehicle, follow-up traveling based on inter-vehicle distance, travelling at kept vehicle speed, collision alarm of the vehicle, lane deviation alarm of the vehicle, or the like. Further, the microcomputer 7610 may perform cooperative control for automatic driving or the like as autonomous traveling without driver's operation by controlling the driving force generation apparatus, the steering mechanism, the brake apparatus, or the like on the basis of the obtained vehicle's surrounding information.

The microcomputer 7610 may generate 3D distance information between the vehicle and an object such as surrounding building or person and create local map information including the surrounding information associated with a current position of the vehicle on the basis of the information obtained via at least one of the general-purpose communication I/F 7620, the dedicated communication I/F 7630, the positioning part 7640, the beacon reception part 7650, the in-vehicle device I/F 7660, and the vehicle-mounted network I/F 7680. Further, the microcomputer 7610 may predict a possibility such as collision of the vehicle, approach of a pedestrian or the like, or entry into road blocked on the basis of the obtained information, and may generate an alarm signal. The alarm signal may be a signal for issuing an alarm sound or lighting an alarm lamp, for example.

The speech/image output part 7670 transmits an output signal of at least one of speech or image to an output apparatus capable of visually or aurally notifying information for the passengers in the vehicle or the outside of the vehicle. The example of FIG. 21 illustrates output apparatuses such as an audio speaker 7710, a display part 7720, and an instrument panel 7730. The display part 7720 may include at least one of an on-board display and a head-up display, for example. The display part 7720 may have an augmented reality (AR) display function. The output apparatus may be a wearable device such as headphones or passenger-worn glass-type display, or other apparatus such as projector or lamp in addition to the above apparatuses. In a case where the output apparatus is a display apparatus, the display apparatus visually displays the results obtained by various processings performed by the microcomputer 7610 or the information received from other control units in various formats such as text, image, table, and graph. Further, in a case where the output apparatus is a speech output apparatus, the speech output apparatus converts an audio signal configured of reproduced speech data, acoustic data, or the like into an analog signal and aurally outputs the analog signal.

Additionally, in the example illustrated in FIG. 21, at least two control units connected via the communication network 7010 may be integrated into one control unit. Alternatively, an individual control unit may be configured of a plurality of control units. Further, the vehicle control system 7000 may include other control unit (not illustrated). Further, in the above description, part or all of the functions served by any control unit may be served by other control unit. That is, if information is exchanged via the communication network 7010, predetermined computation processings may be performed in any control unit. Similarly, a sensor or apparatus connected to any control unit may be connected to other control unit, and a plurality of control units may mutually exchange detection information via the communication network 7010.

For example, the technology according to the present disclosure is suitably applicable to the imaging part 7410 in the vehicle control system 7000 and the imaging parts 7910, 7912, 7914, 7916, and 7918 described above. More specifically, the technology according to the present disclosure is suitably applicable to the imaging part 7410 and the imaging devices in the imaging parts 7910, 7912, 7914, 7916, and 7918, for example. The technology according to the present disclosure is applied so that a high-quality image in which an occurrence of a sunspot phenomenon is restricted can be obtained, thereby improving an accuracy of detecting a leading vehicle, a pedestrian, an obstacle, a traffic light, a traffic sign, a lane, and the like, for example.

Additionally, embodiments of the technology according to the present disclosure are not limited to the above embodiments, and can be variously modified without departing from the spirit of the technology according to the present disclosure.

<6-5. Exemplary Combinations of Configurations>

Further, for example, the technology according to the present disclosure can take the following configurations.

(1) An imaging device including:

a sample/hold part configured to sample and hold a reset voltage as a reset level voltage of a pixel signal; and an AD conversion part configured to analog digital (AD) convert the pixel signal, in which the AD conversion part selects and outputs one of a first output signal as the AD converted pixel signal and a second output signal at a predetermined level on the basis of a comparison result between the reset voltage held by the sample/hold part and a predetermined reference voltage.

(2) The imaging device according to (1), in which the sample/hold part outputs a comparison signal indicating a comparison result between the held reset voltage and the reference voltage, and the AD conversion part selects and outputs one of the first output signal and the second output signal on the basis of the comparison signal.

(3) The imaging device according to (2), in which the sample/hold part includes a circuit configured to switch on or off inputs of a reference signal indicating the reference voltage and the pixel signal, switches on an input of the reference signal in a state where the reset voltage is being held, and outputs an output signal a voltage of which varies depending on a magnitude relationship between the held reset voltage and the reference voltage as the comparison signal.

(4) The imaging device according to (3), in which the sample/hold part switches off an input of the reference signal after outputting the comparison signal, and then outputs the reset voltage.

(5) The imaging device according to (3) or (4), in which the sample/hold part switches on an input of the reference signal in a state where the reset voltage is being held while settling a data voltage as a data level voltage of the pixel signal, and outputs the comparison signal.

(6) The imaging device according to any of (2) to (5), further including:

a delay part configured to delay the comparison signal by a predetermined time and to supply the delayed comparison signal to the AD conversion part.

(7) The imaging device according to (1), further including:

a comparison part configured to output a comparison signal indicating a comparison result between the reset voltage output from the sample/hold part and the reference voltage, in which the AD conversion part selects and outputs one of the first output signal and the second output signal on the basis of the comparison signal.

(8) The imaging device according to (7), further including:

a delay part configured to delay the comparison signal by a predetermined time and to supply the delayed comparison signal to the AD conversion part.

(9) The imaging device according to (7) or (8), in which the sample/hold part outputs the held reset voltage while settling a data voltage as a data level voltage of the pixel signal, and the comparison part compares the reset voltage output from the sample/hold part with the reference voltage, and outputs the comparison signal.

(10) The imaging device according to any of (1) to (9), further including:
    a kTC cancel part configured to reduce kTC noises in the sample/hold part.
(11) The imaging device according to (10),
    in which the kTC cancel part accumulates charges corresponding to a variance of an output voltage of the sample/hold part due to the kTC noises, and feeds back the charges to the sample/hold part to reduce the kTC noises.
(12) The imaging device according to any of (1) to (11),
    in which the reference voltage is set at a voltage obtained by adding a voltage with a difference between a maximum value and a minimum value of an input voltage at which the AD conversion part normally operates or more to a limit voltage as a minimum value in a voltage range in which AD conversion can be normally performed in a vertical signal line configured to transfer the pixel signal.
(13) The imaging device according to (12), further including:
    a reference voltage generation part configured to generate and output the reference voltage.
(14) The imaging device according to (13),
    in which the reference voltage generation part sets the reference voltage on the basis of a detection result of the limit voltage.
(15) The imaging device according to (13),
    in which the reference voltage generation part generates and outputs the reference voltage at a preset level.
(16) The imaging device according to any of (1) to (15),
    in which the first output signal is a signal based on a difference between the reset voltage output from the sample/hold part and a data voltage as a data level voltage of the pixel signal.
(17) The imaging device according to any of (1) to (16),
    in which the second output signal is a signal at the highest luminance level.
(18) The imaging device according to any of (1) to (17),
    in which a plurality of sample/hold parts are connected to vertical signal lines configured to transfer the pixel signal, respectively, and one or more of the plurality of sample/hold parts sample and hold the reset voltage.
(19) The imaging device according to any of (1) to (18), on which a first substrate on which a pixel configured to output the pixel signal is provided, and a second substrate on which the sample/hold part is provided are laminated.
(20) An electronic device including:
    an imaging device; and
    a signal processing part configured to process a signal output from the imaging device,
    in which the imaging device includes:
    a sample/hold part configured to sample and hold a reset voltage as a reset level voltage of a pixel signal; and
    an AD conversion part configured to analog digital (AD) convert the pixel signal, and
    the AD conversion part selects and outputs one of a first output signal as the AD converted pixel signal and a second output signal at a predetermined level on the basis of a comparison result between the reset voltage held by the sample/hold part and a predetermined reference voltage.

REFERENCE SIGNS LIST 10, 10A to 10C Imaging device
11 Pixel region
12 Vertical drive circuit
13 Column signal processing circuit
14 Horizontal drive circuit
15 Output circuit
16 Control circuit
21 Pixel
23 Vertical signal line
51 Semiconductor substrate
52 First semiconductor substrate
53 Second semiconductor substrate
61 Control region
62 Logic circuit
101 Transfer gate control line
102 Reset gate control line
103 Constant current source
111 Photoelectric conversion device
112 Transfer gate part
113 Reset gate part
114 FD part
115 Amplification transistor
116 Select transistor
104 AD conversion circuit
201 Signal processing part
211 Sample/hold circuit
212 Reference voltage generator
213 Comparator
214 Delay device
221 Capacitor
222 Constant current source
223 Transistor
251 Signal processing part
261 kTC cancel circuit
271 to 274 Capacitor
301 Signal processing part
311 Sample/hold circuit
312 Delay device
351 Signal processing part
SW1 to SW4, SW11 Switch
500 Electronic device
502 Imaging device

The invention claimed is:
1. An imaging device, comprising:
    a plurality of vertical signal lines;
    a sample/hold part configured to sample a reset voltage and hold the sampled reset voltage, wherein the reset voltage is a reset level voltage of a pixel signal associated with the imaging device; and
    an AD conversion part configured to:
        analog digital (AD) convert the pixel signal;
        select one of a first output signal as the AD converted pixel signal or a second output signal at a specific level based on a comparison result between the held reset voltage and a specific reference voltage, wherein
            the specific reference voltage is a sum of a specific voltage and a limit voltage,
            the specific voltage is equal to or higher than a difference between a maximum value of an input voltage associated with a normal operation of the AD conversion part and a minimum value of the input voltage associated with the normal operation,
            the input voltage is an input of the sample/hold part,
            the limit voltage is a minimum value in a voltage range of the pixel signal,
            the voltage range corresponds to a range of the normal operation in a vertical signal line of the plurality of vertical signal lines, and
            the vertical signal line is configured to transfer the pixel signal; and output the selected one of the first output signal or the second output signal.

2. The imaging device according to claim 1, wherein the sample/hold part is further configured to output a comparison signal that indicates the comparison result between the held reset voltage and the specific reference voltage, and
the AD conversion part is further configured to:
select one of the first output signal or the second output signal based on the comparison signal; and
output the selected one of the first output signal or the second output signal.

3. The imaging device according to claim 2, wherein the sample/hold part further comprises a circuit configured to:
switch on an input of a reference signal based on the reset voltage being held by the sample/hold part, wherein the reference signal indicates the specific reference voltage, and
output an output signal, wherein
a voltage of the output signal varies based on a magnitude relationship between the held reset voltage and the specific reference voltage, and
the magnitude relationship is the comparison signal.

4. The imaging device according to claim 3, wherein the sample/hold part is further configured to:
switch off the input of the reference signal after outputting the comparison signal outputted from the sample/hold part, and
output the reset voltage based on the switch off of the input of the reference signal.

5. The imaging device according to claim 3, wherein the sample/hold part is further configured to:
switch on the input of the reference signal based on the reset voltage being held by the sample/hold part, wherein
the reset voltage is held by the sample/hold part at a time of settlement of a data voltage, and
the data voltage is a data level voltage of the pixel signal, and
output the comparison signal.

6. The imaging device according to claim 2, further comprising a delay part configured to:
delay the comparison signal by a specific time; and
supply the delayed comparison signal to the AD conversion part.

7. The imaging device according to claim 1, further comprising a comparison part configured to output a comparison signal that indicates the comparison result between the held reset voltage and the specific reference voltage, wherein the AD conversion part is further configured to:
select one of the first output signal or the second output signal based on the comparison signal; and
output the selected one of the first output signal or the second output signal.

8. The imaging device according to claim 7, further comprising a delay part configured to:
delay the comparison signal by a specific time; and
supply the delayed comparison signal to the AD conversion part.

9. The imaging device according to claim 7, wherein the sample/hold part is further configured to output the held reset voltage at a time of settlement of a data voltage,
the data voltage is a data level voltage of the pixel signal, and
the comparison part is further configured to:
compare the held reset voltage with the specific reference voltage, and
output the comparison signal.

10. The imaging device according to claim 1, further comprising a kTC cancel part configured to reduce kTC noises in the sample/hold part.

11. The imaging device according to claim 10, wherein the kTC cancel part is further configured to:
accumulate charges corresponding to a variance of an output voltage of the sample/hold part, wherein the variance of the output voltage is based on the kTC noises, and
feed back the charges to the sample/hold part to reduce the kTC noises.

12. The imaging device according to claim 1, further comprising a reference voltage generation part configured to:
generate the specific reference voltage; and
output the specific reference voltage.

13. The imaging device according to claim 12, wherein the reference voltage generation part is further configured to set the specific reference voltage based on a detection result of the limit voltage.

14. The imaging device according to claim 12, wherein the reference voltage generation part is further configured to:
generate the specific reference voltage at a preset level; and
output the specific reference voltage at the preset level.

15. The imaging device according to claim 1, wherein the first output signal is a signal based on a difference between the held reset voltage and a data voltage, and
the data voltage is a data level voltage of the pixel signal.

16. The imaging device according to claim 1, wherein the second output signal is a signal at a highest luminance level of the pixel signal.

17. The imaging device according to claim 1, wherein
a plurality of sample/hold parts is connected to the plurality of vertical signal lines configured to transfer the pixel signal,
the plurality of sample/hold parts includes the sample/hold part, and
at least one of the plurality of sample/hold parts is configured to:
sample the reset voltage; and
hold the sampled reset voltage.

18. The imaging device according to claim 1, further comprising:
a first substrate;
a pixel on the first substrate, wherein the pixel is configured to output the pixel signal; and
a second substrate, wherein the sample/hold part is on the second substrate.

19. An electronic device, comprising:
an imaging device; and
a signal processing part configured to process a signal output from the imaging device,
wherein the imaging device comprises:
a vertical signal line;
a sample/hold part configured to sample a reset voltage and hold the sampled reset voltage, wherein the reset voltage is a reset level voltage of a pixel signal associated with the imaging device; and an AD conversion part configured to:
  analog digital (AD) convert the pixel signal,
  select one of a first output signal as the AD converted pixel signal or a second output signal at a specific level based on a comparison result between the held reset voltage and a specific reference voltage, wherein
    the specific reference voltage is a sum of a specific voltage and a limit voltage,
    the specific voltage is equal to or higher than a difference between a maximum value of an input voltage associated with a normal operation of the AD conversion part and a minimum value of the input voltage associated with the normal operation,
    the input voltage is an input of the sample/hold part, the limit voltage is a minimum value in a voltage range of the pixel signal, and the voltage range corresponds to a range of the normal operation in the vertical signal line; and
  output the selected one of the first output signal or the second output signal.

20. An imaging device, comprising:
a sample/hold part configured to sample a reset voltage and hold the sampled reset voltage, wherein the reset voltage is a reset level voltage of a pixel signal associated with the imaging device;
a kTC cancel part configured to reduce kTC noises in the sample/hold part; and
an AD conversion part configured to:
  analog digital (AD) convert the pixel signal;
  select one of a first output signal as the AD converted pixel signal or a second output signal at a specific level based on a comparison result between the held reset voltage and a specific reference voltage; and
  output the selected one of the first output signal or the second output signal.

* * * * *